(12) United States Patent
Pfannenberg

(10) Patent No.: US 9,889,397 B2
(45) Date of Patent: Feb. 13, 2018

(54) AIR PASSAGE DEVICE

(71) Applicant: Pfannenberg GmbH, Hamburg (DE)

(72) Inventor: Andreas Pfannenberg, Hamburg (DE)

(73) Assignee: PFANNENBERG GMBH, Hamburg (DE)

( * ) Notice: Subject to any disclaimer, the term of this patent is extended or adjusted under 35 U.S.C. 154(b) by 800 days.

(21) Appl. No.: 14/245,727

(22) Filed: Apr. 4, 2014

(65) Prior Publication Data

US 2014/0215981 A1  Aug. 7, 2014

Related U.S. Application Data

(62) Division of application No. 11/879,028, filed on Jul. 13, 2007, now Pat. No. 9,039,500.

(30) Foreign Application Priority Data

Jul. 13, 2006 (DE) .................... 20 2006 010 888 U
Nov. 1, 2006 (DE) .................... 20 2006 016 841 U

(51) Int. Cl.
*B01D 46/00* (2006.01)
*F04D 29/64* (2006.01)
(Continued)

(52) U.S. Cl.
CPC ....... *B01D 46/0005* (2013.01); *F04D 29/646* (2013.01); *F04D 29/703* (2013.01);
(Continued)

(58) Field of Classification Search
CPC .... F04D 29/646; F04D 29/703; F24F 13/085; F24F 2001/0096; B01D 46/0005; H05K 7/20181
(Continued)

(56) References Cited

U.S. PATENT DOCUMENTS 2,575,499 A   11/1951   Manow
4,334,899 A   6/1982   McConnell
(Continued)

FOREIGN PATENT DOCUMENTS

DE   4013645   5/1991
DE   29505447   5/1995
(Continued)

*Primary Examiner* — Gregory Huson
*Assistant Examiner* — Dana Tighe
(74) *Attorney, Agent, or Firm* — Lucas & Mercanti, LLP; Klaus P. Stoffel

(57) ABSTRACT

An air passage device for installation into a mounting opening in a wall of a housing for components generating waste heat, such as a switching box, has a base housing with a fan support for a fan and a design cover with a fan grid having sheet elements. At least one swivellable sheet element or at least one flexible, tongue-shaped side wall section, separated from the remaining side wall surface of the side walls of the design cover by slits running transversely to the longitudinal direction of the side wall, is formed in the region of the upper side wall of the design cover facing away from the swivel axis for swivelling the design cover. The sheet element and the tongue-shaped side wall section are constructed as a detachable and lockable detent connection, able to be actuated by a finger, between the design cover and the base housing.

8 Claims, 21 Drawing Sheets

(51) Int. Cl.
  *F04D 29/70* (2006.01)
  *F24F 13/08* (2006.01)
  *H05K 7/20* (2006.01)
  *F24F 1/00* (2011.01)

(52) U.S. Cl.
  CPC ....... *F24F 13/085* (2013.01); *H05K 7/20181* (2013.01); *F24F 2001/0096* (2013.01)

(58) Field of Classification Search
  USPC ....... 454/155, 184, 275, 309; 55/385.6, 490, 55/492, 495, 504
  See application file for complete search history.

(56) References Cited

U.S. PATENT DOCUMENTS

| | | | |
|---|---|---|---|
| 5,293,920 A | | 3/1994 | Vagedes |
| 5,679,121 A | * | 10/1997 | Kim ..................... F24F 1/022 55/481 |
| 6,110,245 A | | 8/2000 | Schlag et al. |
| 6,354,936 B1 | * | 3/2002 | Noh ..................... F24F 1/027 16/361 |
| 6,835,127 B2 | | 12/2004 | Smith |
| 7,077,893 B2 | | 7/2006 | Guilliard |
| 7,322,881 B2 | | 1/2008 | Ishii |

FOREIGN PATENT DOCUMENTS

| | | |
|---|---|---|
| DE | 19700065 | 5/1998 |
| DE | 10051643 | 5/2002 |
| DE | 20308482 | 9/2003 |
| DE | 202004006784 | 7/2004 |
| GB | 2149686 | 8/1972 |

* cited by examiner

AIR PASSAGE DEVICE

CROSS-REFERENCE TO RELATED APPLICATIONS

The present application is a Divisional Application of U.S. patent application Ser. No. 11/879,028, filed Jul. 13, 2007, which claims priority of DE 20 2006 010 888.2, filed Jul. 13, 2006, and DE 20 2006 016 841.94 filed Nov. 1, 2006, the priority of these applications is hereby claimed and these applications are incorporated herein by reference.

BACKGROUND OF THE INVENTION

The invention relates to an air passage device, particularly a filter fan or outlet filter.

In the case of components arranged in a housing which generate corresponding waste heat, it is necessary to carry off the waste heat from the housing and control a temperature in the housing by blowing in or drawing off ambient air into the interior of the housing to a greater or lesser extent by means of the fan. Computer housings are a known example of this. Usually, such housings are provided with a filter fan which either runs continuously or is switched on and off by a control arrangement, depending on a temperature in the housing. The filter fan is arranged in a recess of a wall of the housing and is fixed for example by means of screw connections. At the same time, corresponding air outlet slits are provided for the outlet of air at another location in the housing. However, the installation of such filter fans is frequently laborious, because when screw connections are used, there is scarcely any play available in order to be able to also subsequently visually align the filter fan.

The filter mats which are used in these filter fans are arranged between the outer fan grid and the base housing. The fan grid is detachably connected to the base housing by means of clamping- or detent connections or screw connections. If a used filter mat is to be exchanged for a new filter mat, the entire fan grid must be removed from the base housing, with the connection means in most oases having to be loosened by means of tools.

A filter fan housing with an air inlet on the base side and an air outlet which is at right-angles to the air inlet, with the air outlet opening being connected with the interior of a switch box, is known from DE 100 51 643 A1. In the interior of the housing, a filter mat is arranged which assumes an oblique position, so that the air current is guided from the air inlet to the air outlet through the filter mat. The interior of the filter mat housing is accessible via a closable maintenance opening, in order to be able to exchange a filter mat.

DE 40 13 645 A1 discloses an air filter for an electronics housing, which is constructed such that an exchanging of the filter mats is to be possible without interrupting the operation of the apparatus. To do this, the air filter has a filter mat by means of which dust and impurities are able to be removed from an air current which is drawn in from the outside, and a support in which the filter mat is mounted and which comprises a holding frame and a handle for manipulating the support. Furthermore, holding arrangements are provided for the engaging hold of the support in/on the housing with a tight closure with respect to ventilation openings of the housing and guide arrangements, which are mounted on the housing such that the support is movable through an insertion opening in the housing along the guide arrangements to the holding arrangements and out again and is able to be engaged into the holding arrangements.

On the one hand, the filter fan mounts a specially constructed housing, so that the air current can be directed at an angle from the inlet to the outlet through the interior of the housing, which has a separate, closable maintenance opening, in order to be able to grasp hold of the filter mat through the maintenance opening in order to exchange it, whilst on the other hand the air filter housing is provided with a maintenance opening in order to be able to exchange via the latter the filter mat which is constructed in the manner of a cassette.

SUMMARY OF THE INVENTION

It is an object of the present invention to construct an air passage device according to the type described in the introduction so that it is possible to quickly exchange the filter mats without tools and without great structural expenditure, and to open the fan grid effortlessly by the pressure of a finger.

Accordingly, the invention consists in that at least one swivellable sheet element or at least one flexible tongue-shaped side wall section separated from the remaining side wall surface by slits running transversely to the longitudinal direction of the side wall is formed in the region of the upper side wall of the design cover facing away from the swivel, axis for swivelling the design cover, in which the sheet element and the tongue-shaped side wall section are formed as a detent connection which is able to be operated by a finger, is detachable and able to be locked, between the design cover and the base housing.

A first embodiment of the invention consists in that at least one sheet element, preferably the uppermost sheet element, or a section of the sheet element or a sheet element only connected with the upper side wall of the design cover with its longitudinal edge, of the fan grid is swivellably arranged about a rotation axis running in the longitudinal direction of the sheet element in the fan grid, and is constructed as an actuating element, able to be operated by a finger, for an arresting arrangement for locking and releasing a locking arrangement between the fan grid and the base housing.

Through the fact that the design cover with the fan grid together with the filter mat is held swivellably on the base housing of the air passage device, it is possible to exchange the filter mats effortlessly, because the design cover is simply opened up and swivelled so that the filter mat is freely accessible to be exchanged. By opening the design cover, the maintenance opening is provided for exchanging the filter mat, whereby the construction of a separate maintenance opening in the fan housing is dispensed with.

A further advantage consists in that the opening and closing of the design cover takes place by means of a sheet element of the fan grid or a side wall of the design cover. The sheet element is therefore constructed as an actuating element which is able to be operated by a finger for the arrangement for locking and releasing a locking arrangement between the design cover or the fan grid and the base housing.

In order to be able to actuate the said sheet element, according to one embodiment, the latter is preferably held swivellably about its longitudinal axis in the side walls of the design cover or fan grid. Alternatively, the sheet element can be interrupted laterally, in which then the longitudinal axis in the region of the connection to the base housing serves as a swivelling hinge, when this sheet element is formed on the base housing, with this connection region also being able to be formed as a film hinge; however, the use of a flexibly elastic material such as plastic is sufficient in order to make possible a swivelling of the sheet element.

This operable sheet element of the fan grid has a detent cam in the region of its longitudinal edge facing the base housing and facing away from the swivel axis of the fan grid on the base side, which detent cam is able to brought into operative connection for the formation of a detent connection in operative connection with a detent element, for example in the form of a hook or in the manner of a recess. On closing the design cover or fan grid, the elements of the closure arrangement engage reciprocally, so that the filter mat is held securely between the fan grid and the base housing.

The development of the detent connection is not exclusively limited to the upper longitudinal edge of the swivellable sheet element. The individual elements for the detent connection can be arranged both on the longitudinal edge of the swivellable sheet element centrally or eccentrically, in which in the latter case one or more detent connections can then be provided, which are constructed and arranged so that the detent connections are constructed in the region of the lateral wall surfaces of the design cover.

A further development of the invention makes provision that in the side wall facing the uppermost sheet element, of the fan grid, a wall section is formed by slits running transversely to the longitudinal direction of the side wall, on which wall section an unconnected sheet element is formed with its longitudinal edge in the opposite side walls of the design cover, in which in the region of the forming on of the sheet element on the side wall section of the side wall of the design cover, the longitudinal axis LA lies for the swivelling of the side wall section on operation by finger of the sheet element. In this embodiment also the connection region between the side wall and the sheet element forms the swivel axis for the side wall section in order to be able to swivel it.

A tool-free exchanging of the filter mat is therefore possible, so that the filter mats can also be exchanged when the air passage device is in the installed state. By external actuation of the swivellable sheet element, an effortless opening of the design cover is possible to free the filter mat for removal. After the filter mat has been exchanged, the design cover is merely swivelled towards the base housing of the air passage device, so that the detent connection is produced and the receiving space for the filter mat is closed.

A second embodiment of the invention consists in that in the side wall of the design cover facing away from the swivel axis for swivelling the design cover, at least one elastic, tongue-shaped side wall section is formed, separated from the remaining side wall surface by slits running transversely to the longitudinal direction of the side wall, which side wall section is flexibly elastic and has a restoring capacity due to the material of which the design cover consists, in which the tongue-shaped side wall section is held by means of a cross-piece in the side wall and has an engagement element in the region of its free end for the production of a detachable detent connection between the design cover and the base housing, which engagement element is able to be brought into operative connection with a holding element which is mounted or formed on the side wall of the base housing which corresponds to the side wall of the design cover.

By this embodiment of the invention, it is also achieved that the design cover with the fan grid is held together with the filter mat swivellably on the base housing of the air passage device, so that an exchanging of the filter mats can be carried out effortlessly, because the design cover is simply opened out and swivelled, so that the filter mat is freely accessible for exchanging. By opening the design cover, the maintenance opening is provided for the exchange of the filter mat, whereby the construction of a separate maintenance opening in the fan housing is dispensed with.

A further advantage consists in that the opening and closing of the design cover is simplified in that the side wall of the design cover, facing away from the swivel axis of the design cover, has at least one flexibly elastic tongue-shaped section formed from the side wall material, which is provided with an engagement element which, on closing of the design cover, engages into a holding element which is formed or constructed on the side wall of the base housing corresponding to the side wall of the design cover having the tongue-shaped side wall section, so that on closing of the design cover, the engagement element of the tongue-shaped side wall section engages or catches into the holding element. In this process, the bent, tongue-shaped side wall section springs back into its initial position, so that the design cover is locked with the base housing. For unlocking, the design cover is withdrawn from the base housing, whereby the detent connection is released.

A tool-free changing of the filter mats is therefore likewise possible so that the filter mats can also be changed when the air passage device is in the installed state. By external actuation of the flexibly elastically constructed section in the upper side wall of the design cover, an effortless opening of the design cover is possible to free the filter mat for removal. After the filter mat has been exchanged, the design cover is merely swivelled towards the base housing of the air passage device, so that the detent connection is produced and the mounting space for the filter mat is closed.

A further embodiment of the invention makes provision that for the production of the detachable detent connection between the design cover and the base housing, at least one of the side walls of the frame of the design cover has at least one flexible, tongue-shaped side wall section formed from the material of the side wall, which side wall section is connected on one end side via a cross-piece with the side wall and is held therein, and which at its free end has a detent cam as engagement element, which is able to be brought into operative connection with a holding element which is provided in the side wall of the base housing, corresponding to the side wall of the design cover.

Here, the flexible tongue-shaped side wall section is formed by two longitudinal slits running transversely to the longitudinal direction of the side wall of the frame of the design cover, the length of which slits is smaller than the width of the side wall.

In the upper regions or in the side walls of the design cover and/or of the base housing, at least one tongue-shaped side wall section and at least one holding element, corresponding to the tongue-shaped side wall section, are provided in the respective side walls of the frames of the design cover and of the base housing.

Preferably, the tongue-shaped side wall section and the holding element corresponding thereto are arranged centrally on the side walls of the frames of the design cover and of the base housing.

According to a further embodiment of the invention, in the upper regions or in the side walls of the design cover and of the base housing, corresponding to each other, two tongue-shaped side wall sections and two holding elements, corresponding to the tongue-shaped side wall sections, are provided in the respective side walls of the frames of the design cover and of the base housing.

Furthermore, each tongue-shaped side wall section has at its free end a section bent at right-angles, which engages in or behind a correspondingly formed slit-shaped recess or opening in the corresponding side wall of the frame of the base housing, as a holding element.

A further embodiment provides an air passage device in which each tongue-shaped side wall section of the design cover has a detent cam in the region of its free end, in which on the underside of the side wall of the base housing overlapping the side wall of the design cover, a depression is provided which is formed accordingly corresponding to the shape of the detent cam.

A detent connection which is constructed in such a way provides the advantage that the opening and closing of the design cover is simplified in that the side wall of the design cover, facing away from the swivel axis of the design cover, has at least one flexibly elastic tongue-shaped section formed from the side wall, material, having a detent cam which, on closing of the design cover, engages into a recess or depression which is formed on the underside of the side wall of the base housing corresponding to the side wall of the design cover having the tongue-shaped section, so that on closing of the design cover, the tongue-shaped side wall section is bent until the detent cam engages into the depression on the side wall of the base housing, in which then the tongue-shaped section springs back into its initial position until the detent cam is fully engaged into the depression, so that the design cover is locked with the base housing. For unlocking, the tongue-shaped side wall section is bent downwards, for example by acting upon by a pointed object, so that the design cover is withdrawn from the base housing, in which the detent cam of the base housing moves out from the depression on the side wall of the base housing, in which, owing to the flexibly elastic construction of the tongue-shaped side wall section, the latter is bent slightly on the side wall of the base housing, so that the detent cam can slide out from the depression.

Furthermore, provision is Made that the design cover is swivellably arranged on any desired side wall of the frame of the base housing, in which the detent connection for the design Cover and the base housing is provided on the side walls of the design cover, lying opposite the swivel axis for the design cover, and the base housing.

A further embodiment makes provision that to produce the detachable detent connection between the design cover and the base housing, in at least one of the side walls of the frame of the base housing at least one flexible tongue-shaped side wall section is formed from the material of the side wall, separated from the remaining side wall surface by slits running transversely to the longitudinal direction of the side wall, in which the tongue-shaped side wall section is held in the side wall by means of a cross-piece and on the inner wall side has a holding element in the form of a preferably circular depression or opening, bore or blind-end bore, which is able to be brought into operative connection with an engagement element in the form of a detent cam, which is arranged or formed on the side wall of the design cover corresponding to the side wall of the base housing having the holding element, in which the detent cam is preferably provided at its free end with a section which is partially formed or running in an encircling manner conically to the detent cam end, as a sliding surface.

The invention therefore consists of a connection system for the design cover and the base housing of the air passage connection, which can be released by the pressure of a finger to open the design cover to change the filter mat, and is constructed so that on closing of the design cover, the latter engages into the base housing.

Further advantageous developments of the invention are the subject matter of the sub-claims.

The various features of novelty which characterize the invention are pointed out with particularity in the claims annexed to and forming a part of the disclosure. For a better understanding of the invention, its operating advantages, specific objects attained by its use, reference should be had to the drawings and descriptive matter in which there are illustrated and described preferred embodiments of the invention.

DETAILED DESCRIPTION OF THE INVENTION

Figure 1:
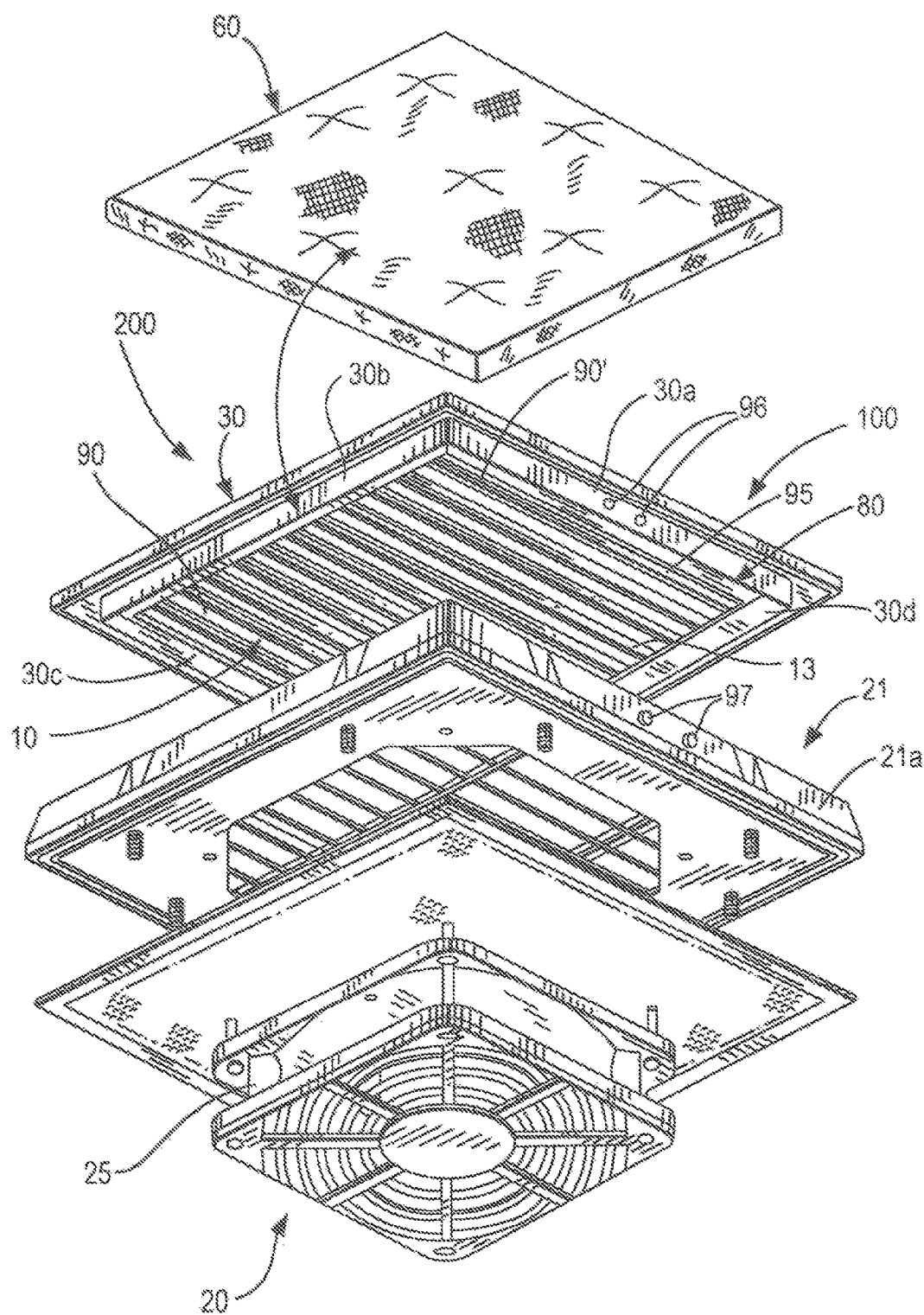
FIG. 1 shows a diagrammatic exploded illustration of the air passage device according to a first embodiment of the invention, consisting of a front design cover with a fan grid and with a filter mat, a base housing for the design cover and for a ventilator and with a sheet element constructed as an actuating element able to be actuated by a finger, for an arresting arrangement for locking and releasing a detent-like locking arrangement between the fan grid or design cover and the base housing of the air passage device.
Figure 2:
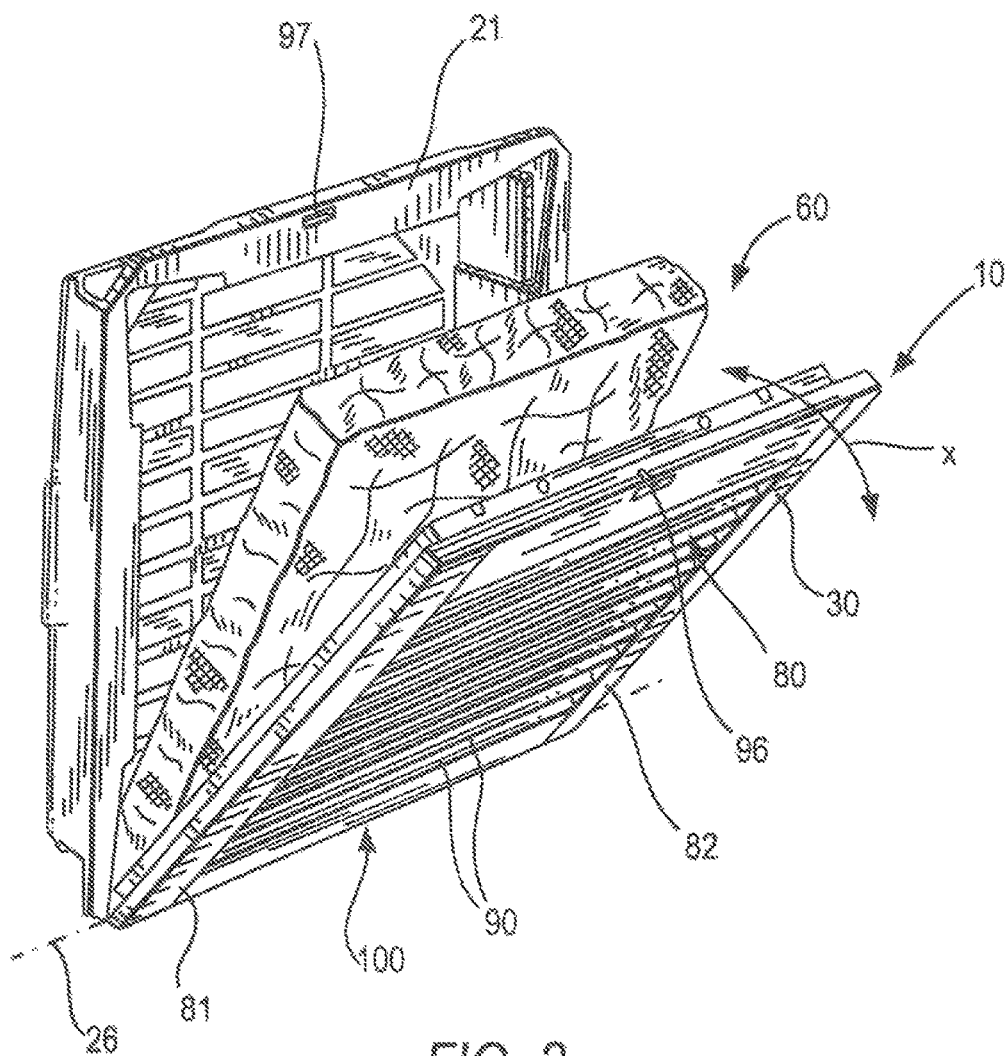
FIG. 2 shows a diagrammatic illustration of the base housing with folded open design cover and with a filter mat of the air passage device according to FIG. 1, lying between the base housing and the design cover.
Figure 3:
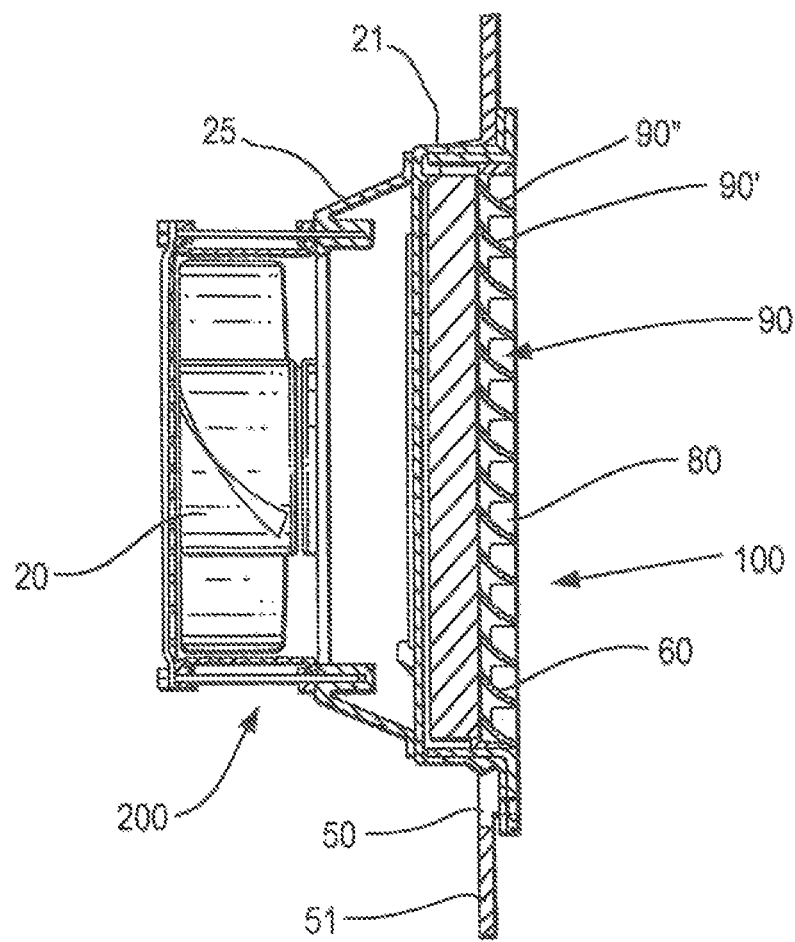
FIG. 3 shows a vertical section through the air passage device.

The air passage device 200 illustrated in FIGS. 1 to 3 of a first embodiment of the invention is able to be used in connection with a fan or ventilator as a filter fan and without a fan 20 as an outlet filter. The air passage device 200 is used in housings of components generating waste heat, such as switch boxes, electronics boxes, computer systems or suchlike, in which the air passage device 200 is incorporated in mounting openings 50 in a wall 51 of such a housing (FIG. 3).

The essential components of the air passage device 200 are a design cover 80 with a fan grid 10 with ventilation slits, which forms the front covering device 100 for a base housing 21, a fan support 25 for the fan 20, when the air passage device 200 is used as a filter fan (FIGS. 1 to 3).

Figure 4:
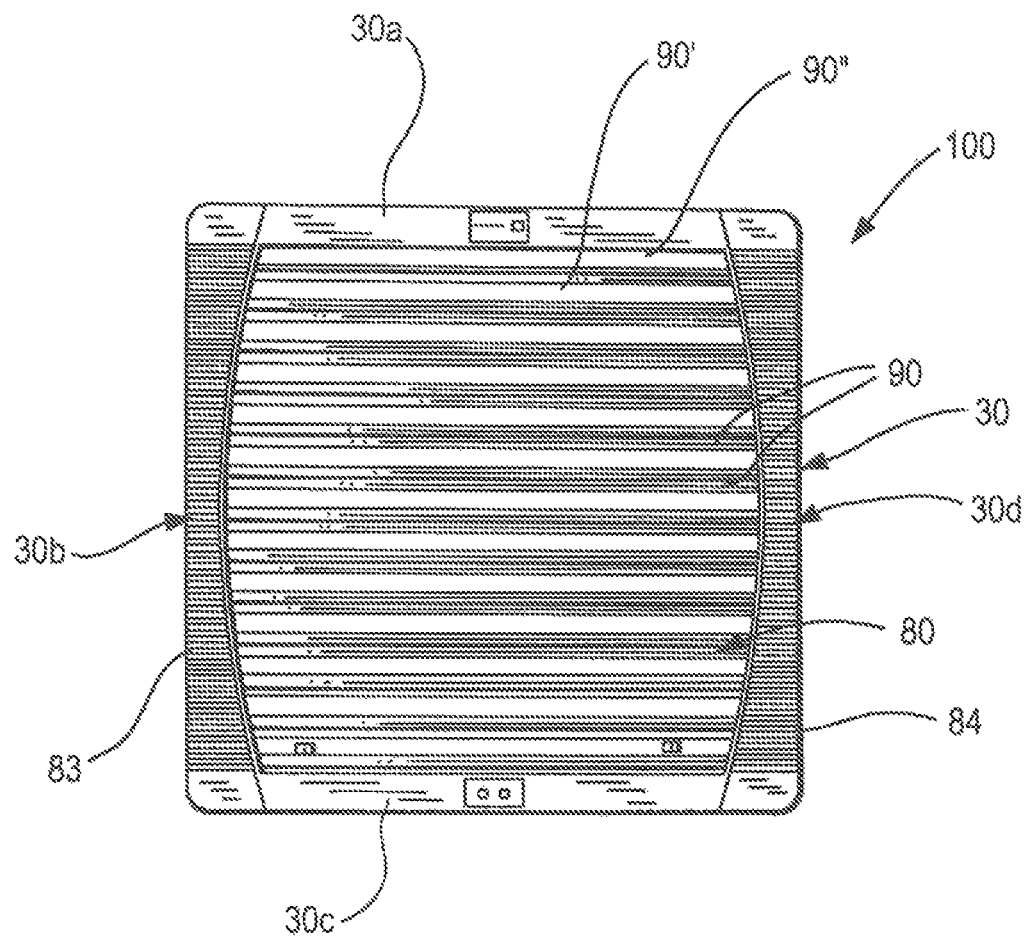
FIG. 4 shows in a front view the fan grid of the design cover with sheet elements.

The covering device 100, which forms the fan grid 10, is constructed as a design cover 80 and consists of a frame-like housing 30, preferably with side walls 30a, 30b, 30c, 30d and with sheet elements 90, in which ventilation slits are formed between the sheet elements 90 which partially overlap each other. The filter mat 60 can be held against the inner wall surface of the fan grid 10 in the design cover 80 (FIG. 3), or it is inserted into the base housing 21, which is closed by means of the design cover 80. The sheet elements 90 are held in two opposite side walls 30b, 30d of the frame-like housing 30 of the design cover 80, or are formed onto these side walls (FIG. 4).

Figure 5:
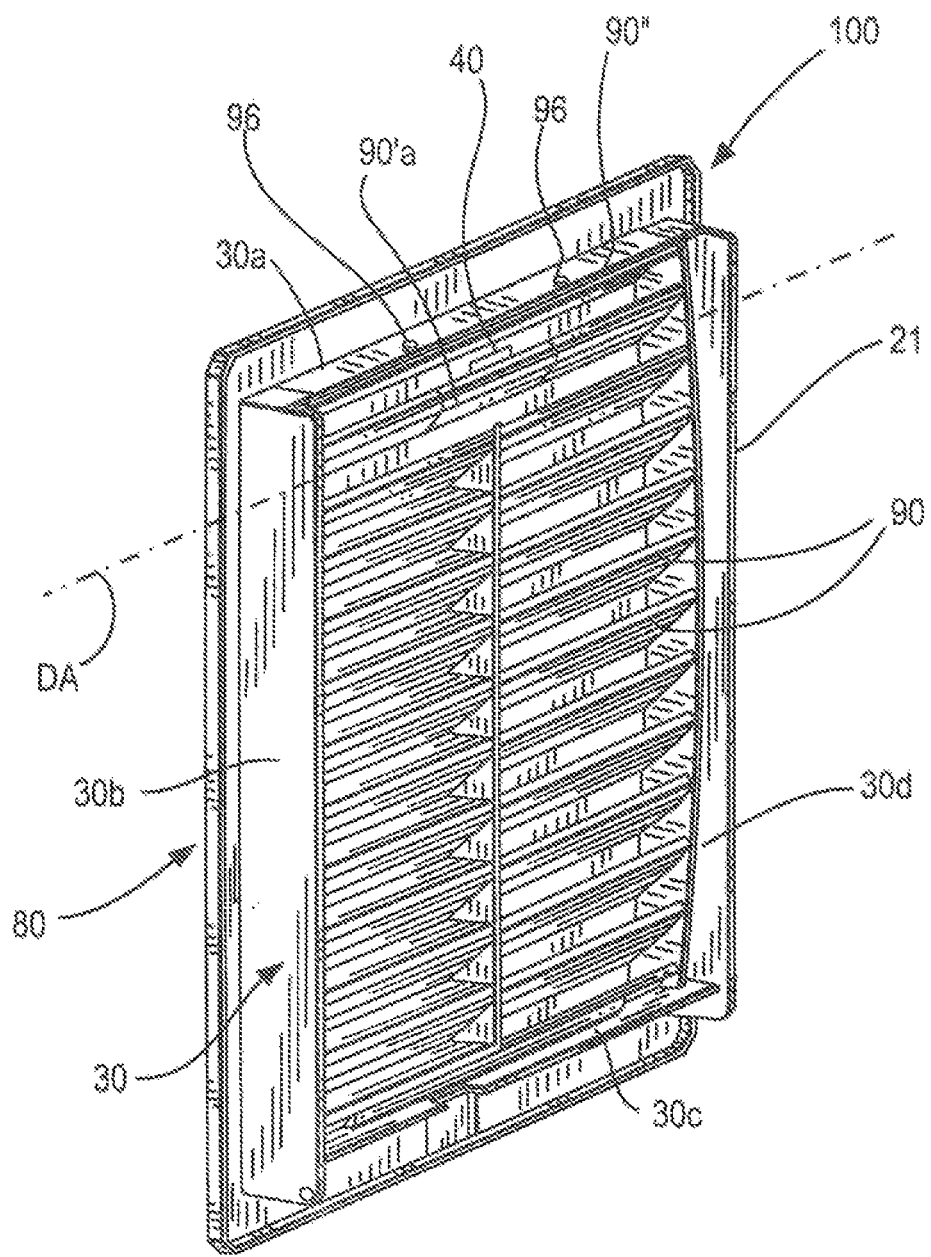
FIG. 5 shows a diagrammatic rear view of the design cover with the fan grid.
Figure 8:
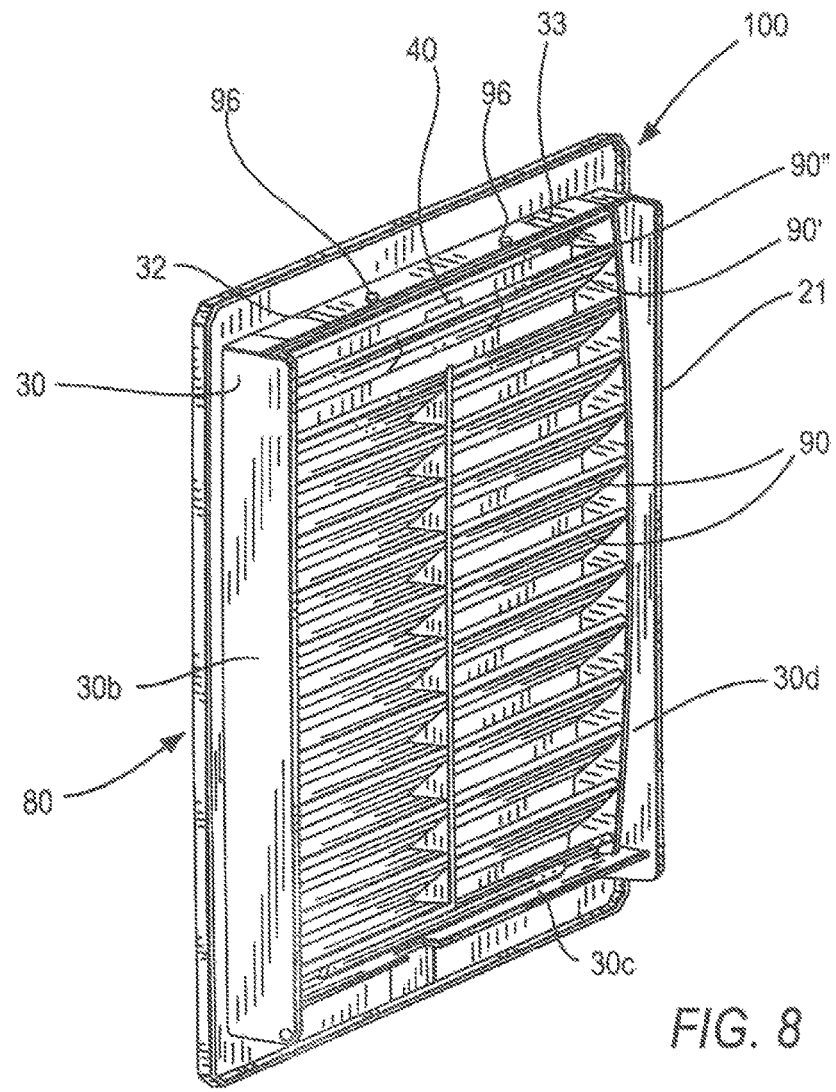
FIG. 8 shows a rear view of the design cover with a side wall constructed as operating element for the arresting device.

The covering device 100 with the fan grid 10 consists of the frame-like housing 30 which receives the filter mat 60, a fan grid 10, held securely, detachably or swivellably in the housing 30 and covering the filter mat 60, forming the design cover 80. This fan grid 10 comprises at least two lateral side walls 30h, 30d extending on the edge side in a longitudinal direction, preferably constructed in the form of cheek pieces, between which the sheet elements 90 are arranged (FIGS. 4, 5 and 8). The sheet elements 90 are arranged at a distance from each other, with partial overlapping at the same time, and are placed obliquely such that the respective front and outer sheet edges 91 are situated lower with respect to the rear sheet edges 92. The upper rear sheet edges 92 preferably have profilings 95 formed in the manner of a barb or hook (FIG. 6), in order to prevent the penetration of water and in order to divert away water acting on the design cover 80.

Figure 7:
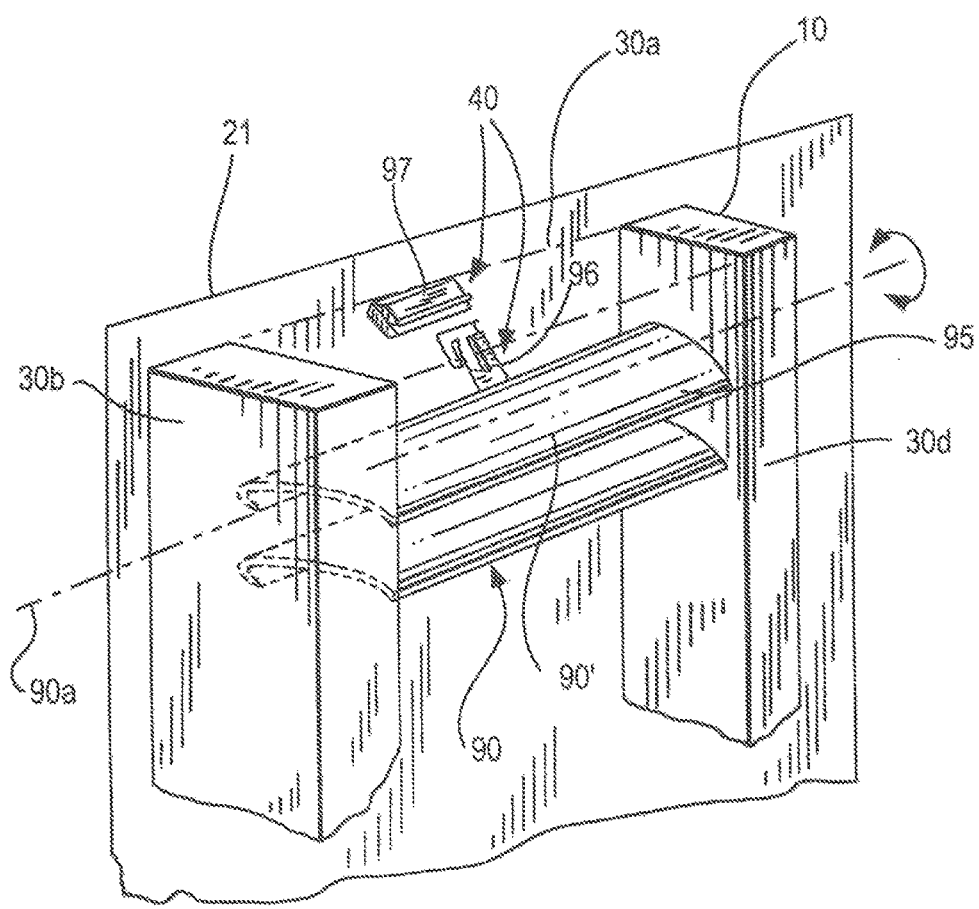
FIG. 7 shows in a diagrammatic view the swivellable sheet element, constructed as operating element, with the arresting device for the detachable fastening of the design cover on the base housing of the air passage device.

The design cover 80 holding the filter mat 60, or the fan grid 10, is swivellable about its swivel axis 26 on the base side in arrow direction X for opening the mounting chamber for the filter mat between the fan grid 10 and the base housing 21 (FIG. 2). The arresting of the fan grid 10 on the base housing 21 preferably takes place in the upper region, e.g. by means of an arresting device 40, preferably of the components 96, 97 which are constructed as detent cam and engagement elements (FIGS. 2 and 7).

Figure 6:
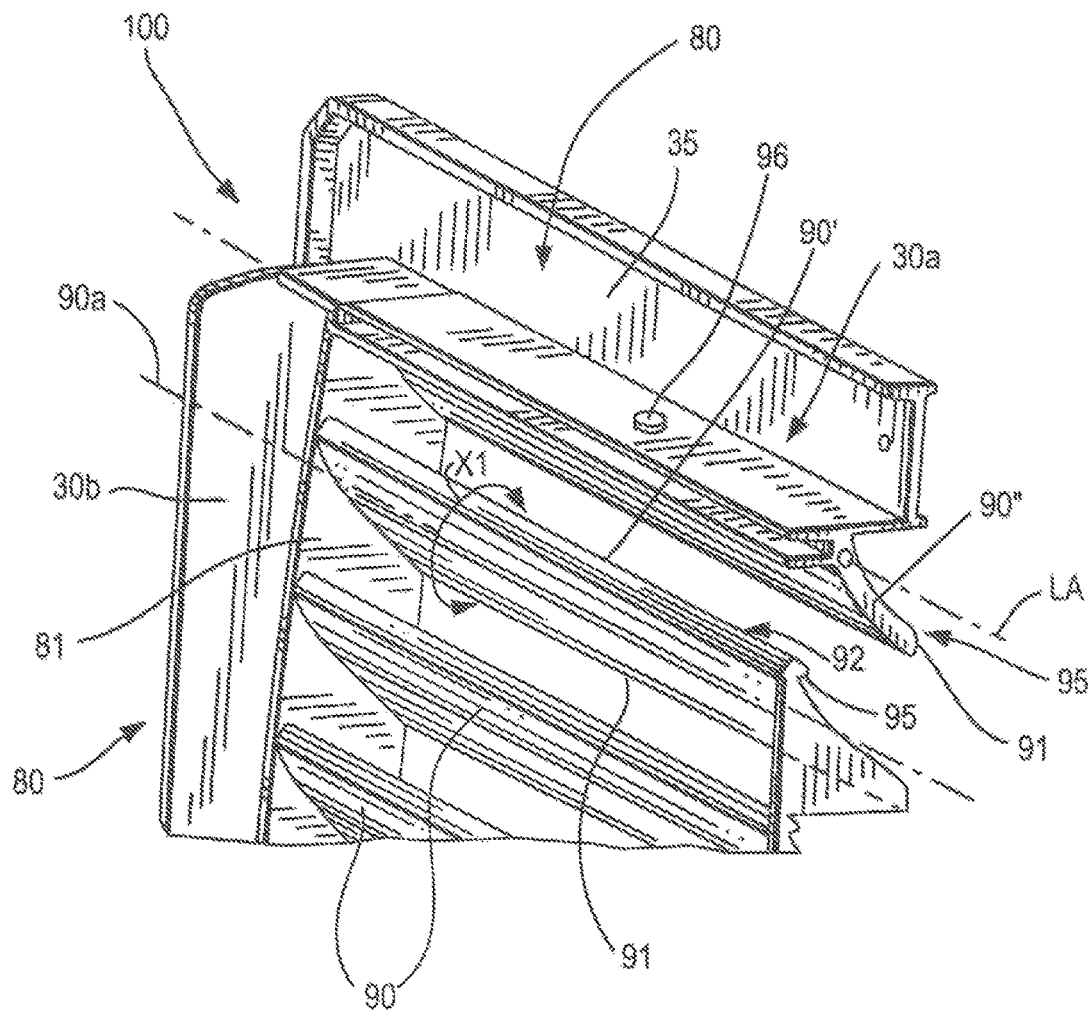
FIG. 6 shows a section of the fan grid of the design cover with a sheet element constructed as operating element, in an enlarged diagrammatic illustration.

The actuation of the arresting device 40 takes place by means of sheet elements 90' or a sheet element 90" of the sheet elements 90 of the fan grid 10. In the embodiment shown in FIGS. 6 and 7, the uppermost sheet element 90' is constructed as an actuating element. To do this, the sheet element 90' is held swivellably in the two side walls 30b, 30d of the frame-like frame 30 in the arrow direction X1, such that the sheet element 90' is swivellable about its longitudinal axis 90a as swivel and rotation axis (FIGS. 6 and 7). Preferably, the sheet element 90' is swivellable about a swivel axis 90a running centrally in the longitudinal direction of the sheet element 90'. The upper, rear sheet edge 92 is then provided with the components of the arresting device 40, in which the arresting device is formed or fastened centrally on the sheet element 90'; however, an eccentric arrangement is also possible (FIG. 7). The possibility also exists of providing the arresting device 40 at one end or at both ends of the sheet element 90', so that the components of this device are then provided respectively at the end regions of the sheet element 90' and on the respective opposite wall surfaces of the base housing 21, so that the components can engage into each other for locking.

At least one sheet element 90' and in fact preferably the respective uppermost sheet element of the fan grid 10 is held swivellably therein. By finger actuation, the sheet element 90' is swivelled so that the arresting or locking between the fan grid 10 and the base housing 21 is released, so that on swivelling of the fan grid in the arrow direction X outwards, the filter mat 60 is freed for removal (FIG. 2). When the design cover 80 and the base housing 21 are folded together, the components of the arresting device 40 then engage into each other.

The arresting device 40 formed on the design cover 80 and the base housing 21 has, for example, on the co-swivelling longitudinal edge 90a of the sheet element 90' on its actuation a detent cam 96 which is able to be brought into operative connection with a hook-shaped or recess-like detent element 97 to form a detent connection, so that on closing of the design cover 80, the detent cam 96 engages into its counter-element, whereas the possibility also exists that also with non-actuation of the sheet element 90' on closing of the design cover 80, the detent connection is produced. To open the detent connection, the sheet element 90' is then swivelled with a finger actuation, in which the detent cam 96 is swivelled out from its engagement position on the base housing 21 and frees the design cover 80 for swivelling into the filter removal position (FIG. 2).

A further embodiment of the invention makes provision that only one section 90'a of the uppermost sheet element 90' is constructed so as to be swivellable about a rotation axis DA in the fan grid 10, running in the longitudinal direction of the sheet element 90' (FIG. 5).

Figure 9:
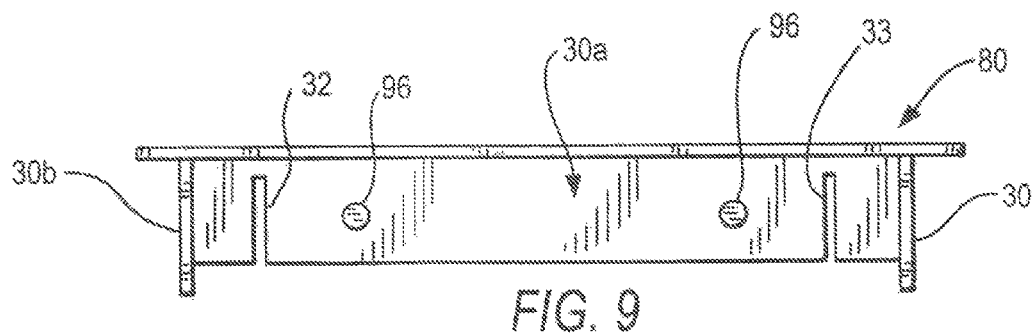
FIG. 9 shows an enlarged view from above onto the design cover with the side wall constructed as an operating element.

In the embodiment of an air passage device shown in FIGS. 8 and 9, in the side wall 30a facing the uppermost sheet element 90" of the design cover 80 formed with its longitudinal edge on the upper side wall 30a of the frame-like housing 30 of the design cover 80, a side wall section 35 is formed by slits 32, 33 running transversely to the longitudinal direction of the side wall, which side wall section 35 is swivellable about its longitudinal axis LA in the region of its forming 36 on the fan grid 10. This side wall section 35 carries at least one detent cam 96 which is able to be brought into engagement with an opening 97' on the side wall 21a of the housing 21, corresponding to the side wall 30a of the fan grid 10, to form the detent connection (FIG. 1). The actuation of the side wall section 35 takes place in this embodiment by means of the sheet element 90" which is formed in the upper region of the design cover 80. This side wall section 35 of the frame-like housing 30 of the design cover 80 is formed with its longitudinal edge on the sheet element 90' which, however, is not connected by its end regions with the opposite side walls 30b, 30d of the design cover 80 (FIG. 6). The longitudinal axis LA for the swivelling of the side wall section 35 with finger actuation of the sheet element 90" lies in the region of this forming on of the sheet element 90" on the side wall section 35 of the side wall 30a of the design cover 80. This longitudinal axis LA is, at the same time, the rotation axis. By raising the sheet element 90", the side wall section 35 which is securely connected therewith is moved so that the detent connection can be opened. Owing to the use of flexibly elastic plastic, the swivelling of the sheet element 90" and the production of the detent connection is possible by the detent cam(s) 96 on the side wall section 35 engaging into the openings or recesses 97' on the side wall 21a of the housing 21, when the design cover 80 is detachably connected together with the housing 21.

Figure 10:
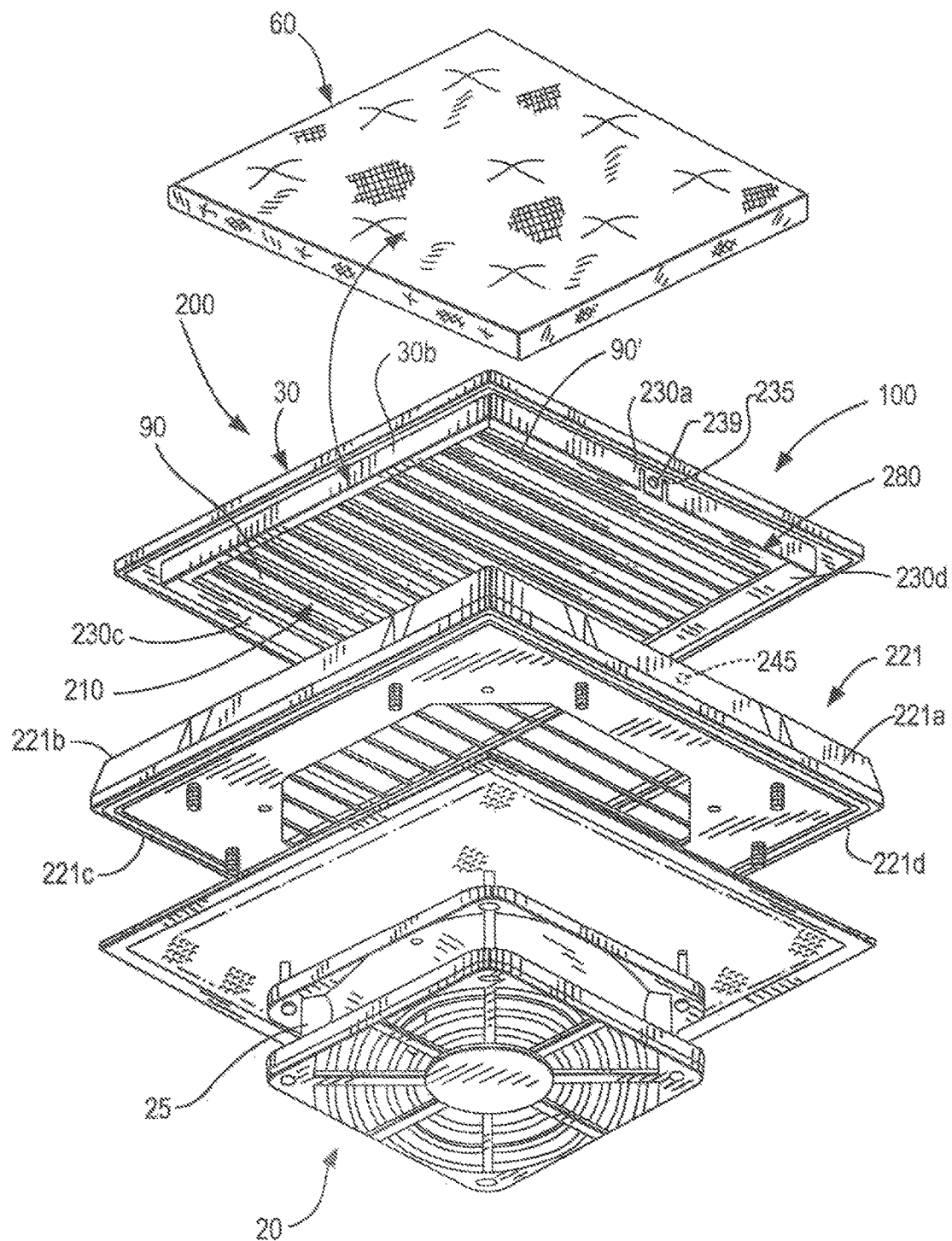
FIG. 10 shows a diagrammatic exploded illustration of the air passage device according to a second embodiment of the invention, consisting of a design cover with a fan grid and with a filter mat and a base housing for the design cover for a ventilator and with a flexible and tongue-shaped side wall section of the design cover constructed as a finger-actuatable actuating element for an arresting arrangement for locking and releasing a detent-like locking arrangement between the fan grid or design cover and the base housing of the air passage device.
Figure 11:
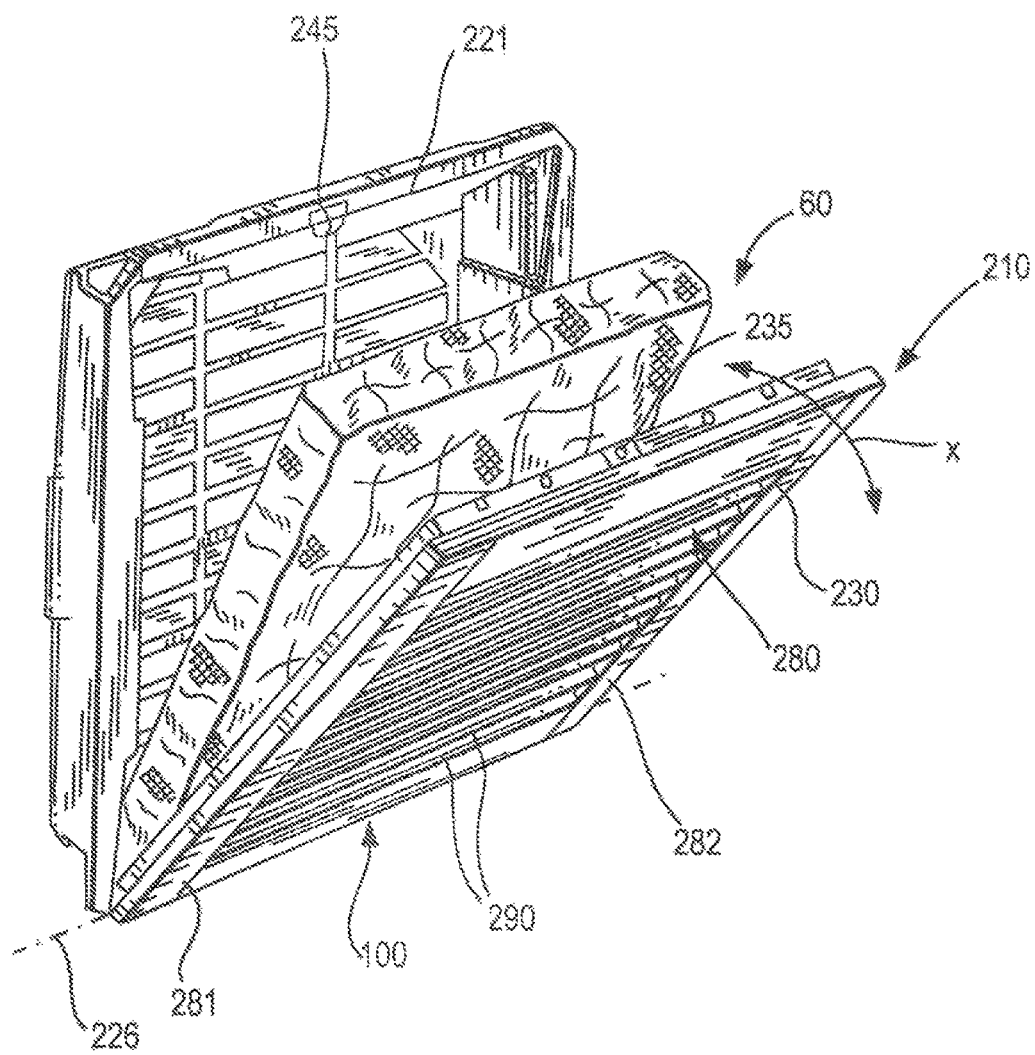
FIG. 11 shows a diagrammatic illustration of the base housing with the design cover folded open and with a filter mat of the air passage device according to FIG. 10 arranged between the base housing and the design cover.
Figure 12:
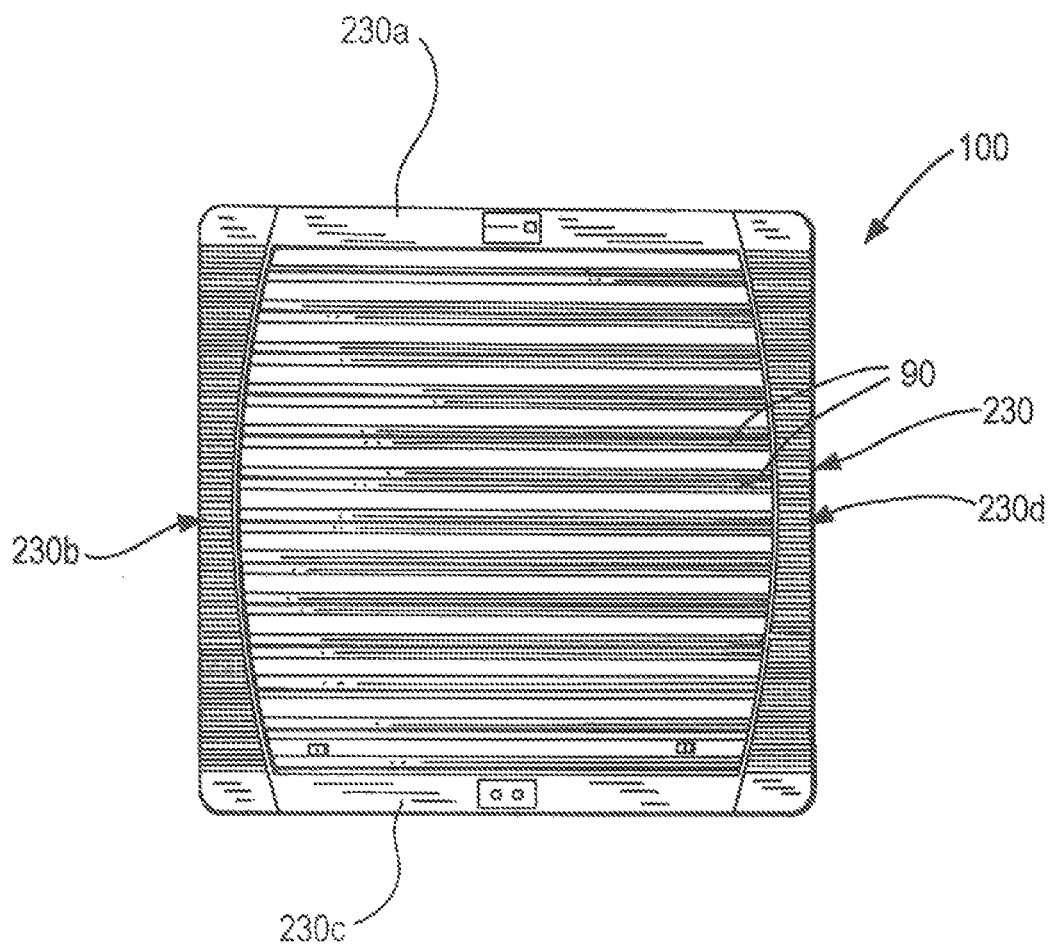
FIG. 12 shows a front view of the air passage device.

The air passage device 200 of the second embodiment of the invention, illustrated in FIGS. 10 to 12, is able to be used in connection with a fan or ventilator as a filter fan, and without a fan 20 as an outlet filter. The air passage device 200 is used in housings of components generating waste heat, such as switch boxes, electronics boxes, computer systems or suchlike, in which the air passage device 200 is installed in mounting openings 50 in a wall 51 of such a housing (FIG. 12).

The essential components of the air passage device 200 are a design cover 280 with a fan grid 210 with ventilation slits, which forms the front covering device 100 for a base housing 221 and a fan support 25 for the fan 20, when the air passage device 200 is used as a filter fan (FIGS. 10 to 1

Figure 13:
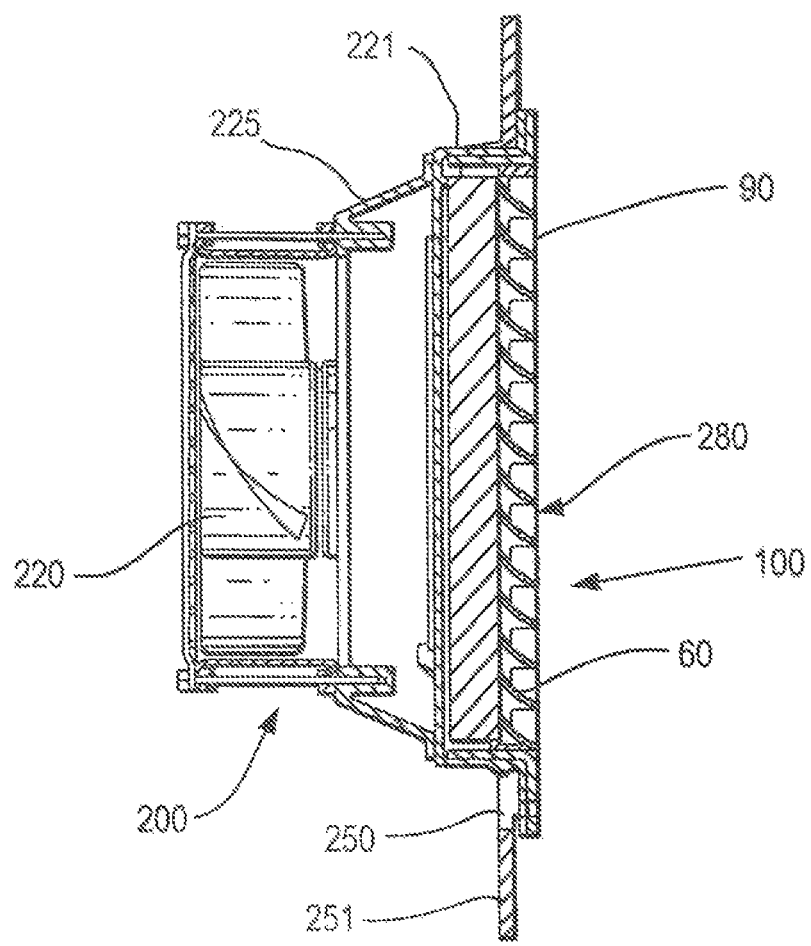
FIG. 13 shows a vertical section through the air passage device.

The covering device 100, which forms the fan grid 210, is constructed as design cover 280 and consists of a frame 230 with side walls 230a, 230b, 230c, 230d and in the embodiment illustrated in the drawing with sheet elements 90, in which ventilation slits are formed between the partially overlapping sheet elements 90. The filter mat 60 is held against the inner wall surface of the fan grid 210 in the frame of the design cover 280 (FIG. 12) or it is inserted into the base housing 221, which is closed by means of the design cover 280. The sheet elements 90 are held in two opposite side walls 230b, 230d of the frame 230 of the design cover 280 or are formed onto these side walls (FIG. 13). The design cover 280 is swivellable about the swivel axis 226, in order to be able to open the design cover for the removal of the filter mat 60. The design cover 280 can also be constructed in the form of a grid.

Figure 14:
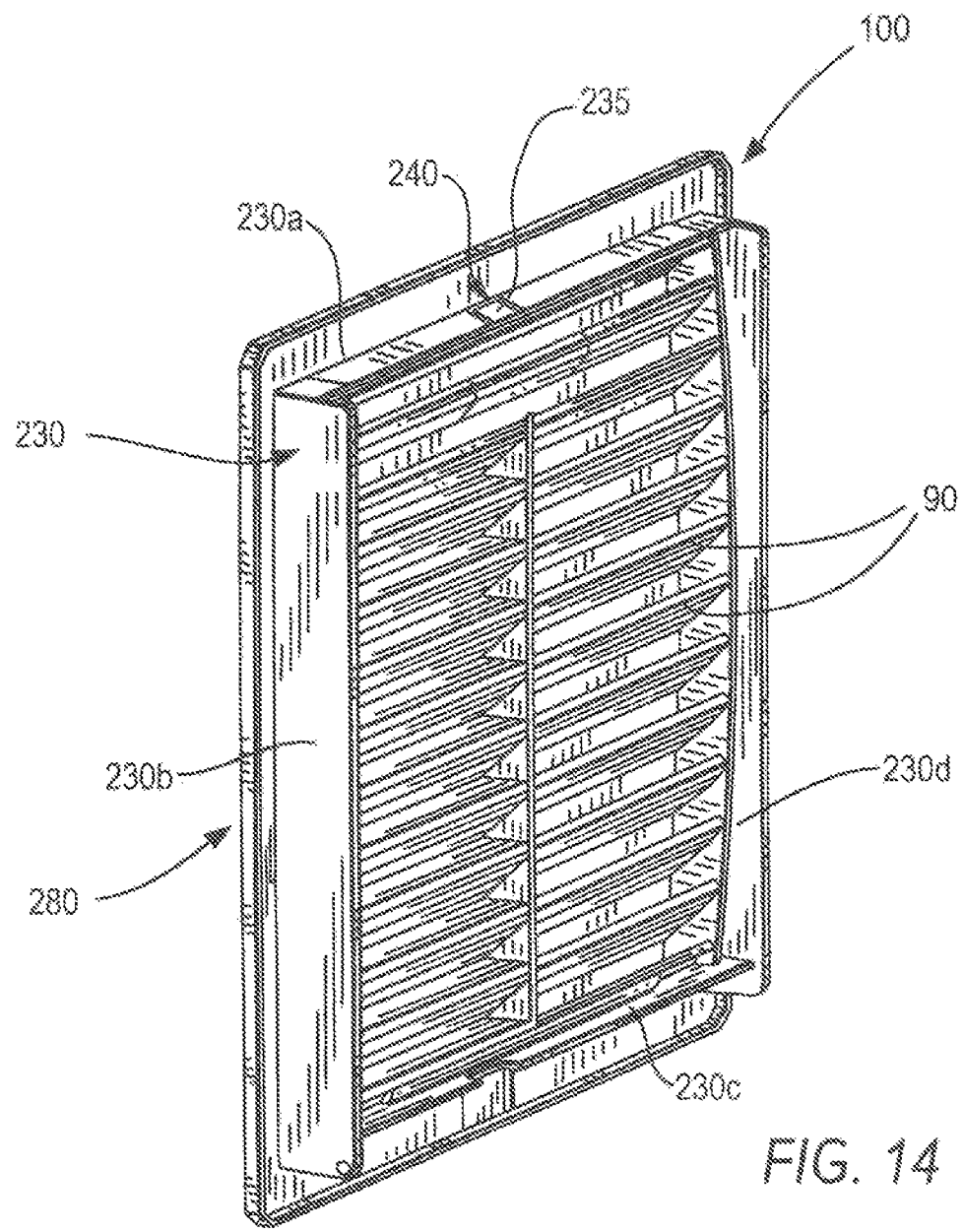
FIG. 14 shows a diagrammatic rear view of the design cover with a flexible, tongue-shaped side wall section in the upper side wall of the frame of the design cover as operating element for the production of a detent connection between the design cover and the base housing of the air passage device, in which the tongue-shaped side wall section has at its free end an engagement element in the form of a detent cam.

The covering device 100 with the fan grid 210 therefore consists of the frame 230 which holds the filter mat 60, a fan grid 210, held securely, detachably or swivellably in the frame 230 and covering the filter mat 60, which fan grid 210 forms the design cover 280. This fan grid 210 comprises at least two lateral side walls 230b, 230d, extending on the edge side in a longitudinal direction, preferably constructed in the form of cheek pieces, between which side walls 230b, 230d the sheet elements 90 are arranged (FIGS. 13 and 14). The sheet elements 90 are arranged at a distance from each other, partially overlapping each other at the same time, and are placed obliquely such that the respective front and outer sheet edges 91 are placed lower with respect to the rear sheet edges 92.

The design cover 280 receiving the filter mat 60, or the fan grid 210, is swivellable in the arrow direction X about its swivel axis 226 on the base side for opening the mounting chamber, formed by the frame 230, for the filter mat between the fan grid 210 and the base housing 221 (FIG. 11). The arresting of the fan grid 210 on the base housing 221 preferably takes place in the upper region e.g. by means of a detent- or arresting device 240, preferably of the components 296, 297 which are constructed as engagement element and as holding element (FIGS. 10,11,15 and 16). The base housing 221 consists of a grid wall 325 and a frame 321 formed thereon with the side walls 221a, 221b, 221c, 221d. If the design cover 280 is folded out onto the base housing 221, then the side walls 230a, 230b, 230c, 230d of the design cover 280 come to lie against the inner wall surfaces of the side walls 221a, 221b, 221c, 221d of the frame 321 of the base housing 221, i.e. the side walls of the frame of the base housing 221 overlap the side walls of the frame of the design cover 280, so that the side walls 230a and 221a, 230b and 221b, 230c and 221c and 230d and 221d correspond to each other.

The design cover 280 therefore engages with its encircling side walls 230a, 230b, 230c, 230d into the encircling side walls 221a, 221b, 221c, 221d of the base housing 221, so that in the folded together state, the design cover 280 lies on the base housing 221 and is held by it, in which the side walls 231a, 221a of the design cover 280, respectively facing away from the swivel axis 226 of the design cover 280, and of the base housing 221 lie on each other. The side wall 221a of the base housing 221 overlaps here the side wall 230a of the design cover 280.

Figure 15:
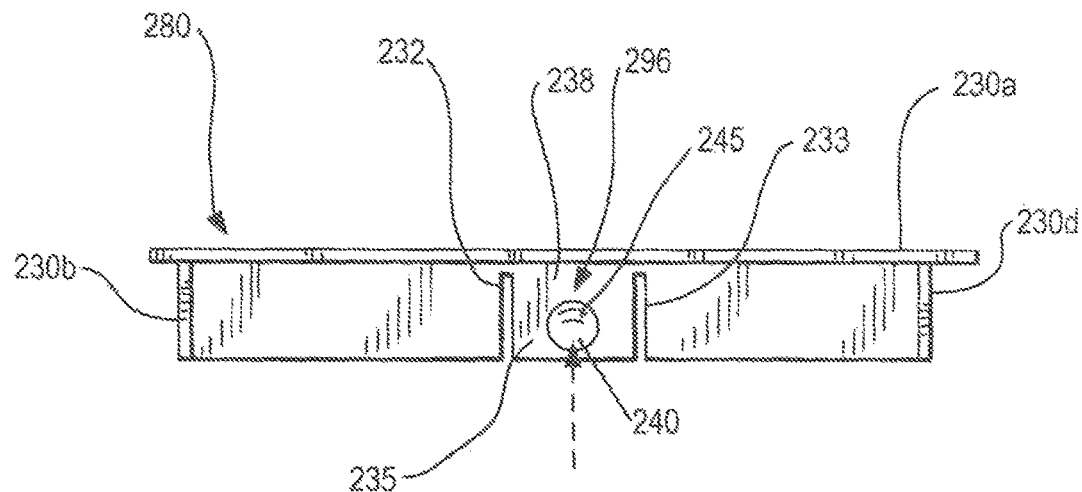
FIG. 15 shows an enlarged view from above onto the design cover with the tongue-shaped side wall section, having the detent cam, formed in the upper side wall of the design cover.
Figure 16:
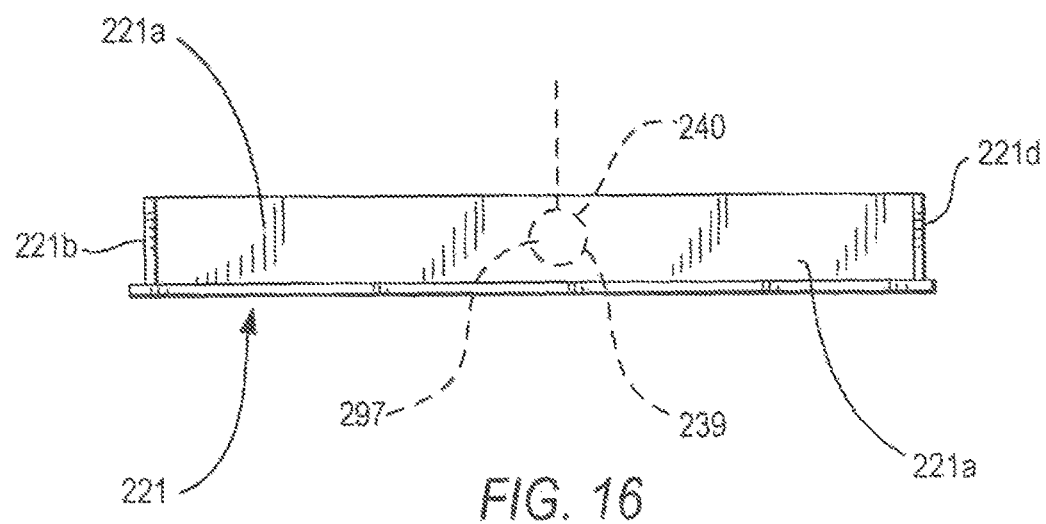
FIG. 16 shows an enlarged view from above onto the base housing with the holding element, formed on the underside of the upper side wall, in the form of a depression for the engagement of the detent cam on the tongue-shaped side wall section.

The detent connection 240 (FIGS. 15 and 16), by means of which the design cover 280 is detachably held on the base housing 221, consists of at least one flexible, tongue-shaped side wall section 235 formed in the side wall 230a of the design cover 280, which is formed by means of slits 232, 233 in the side wall 230a, running transversely to the longitudinal direction of the side wall. This tongue-shaped side wall section 235 is held in a flexibly elastic manner on a cross-piece 238 of the side wall 230a of the design cover 280, so that this tongue-shaped side wall section 235 can avoid a pressure exerted onto the side wall section 235 and, on relief of pressure, can spring back into its initial position (FIGS. 14, 15 and 16).

The flexibly elastic development of the tongue-shaped side wall section 235 of a bent position into the initial position is achieved by the material which is used for the production of the design cover 280, which is plastic or a metal, in which the materials must have flexibly elastic properties.

The tongue-shaped side wall section 235 has an engagement element 296 on the outer wall side, e.g. in the form of a detent cam 245, which cooperates with a holding element 297 which is formed on the underside of the side wall 221a of the base housing 221. This holding element 297 is formed for example as a depression or recess 239 with a shape which corresponds to the shape of the detent cam 245. This detent cam 245 has a shape corresponding to the depression 239, so that when the design cover 280 is closed, the detent cam 245 engages into the depression 239 in the side wall 221a of the base housing 221, so that the design cover 280 is locked with the base housing 221. Instead of a depression 239, an opening may also be provided in the side wall 221a of the base housing 221, into which the detent cam 245 engages on closing of the design cover 280. The depression 239 may furthermore also be constructed in a hemispherical shape or as a blind-end bore. Through the fact that the tongue-shaped side wall section 235 is flexibly elastic, the latter, when the detent cam 245 is moved towards the depression 239 on closing of the design cover 280, is bent downwards and springs back into its initial position owing to its restoring capacity, i.e. into the plane formed by the side wall 230a, when the detent cam 245 comes to lie in the depression 239 (FIGS. 15, 16, 17 and 18).

In the example embodiment illustrated in the drawing, the detent connection 240 of the two components 296, 297 is provided centrally in the side walls 221a, 230a of the base housing 221 and of the design cover 280. The number of detent connections 240 can, however, be selected as desired; it is determined in each case by the size of the air passage device.

Figures 17, 18:
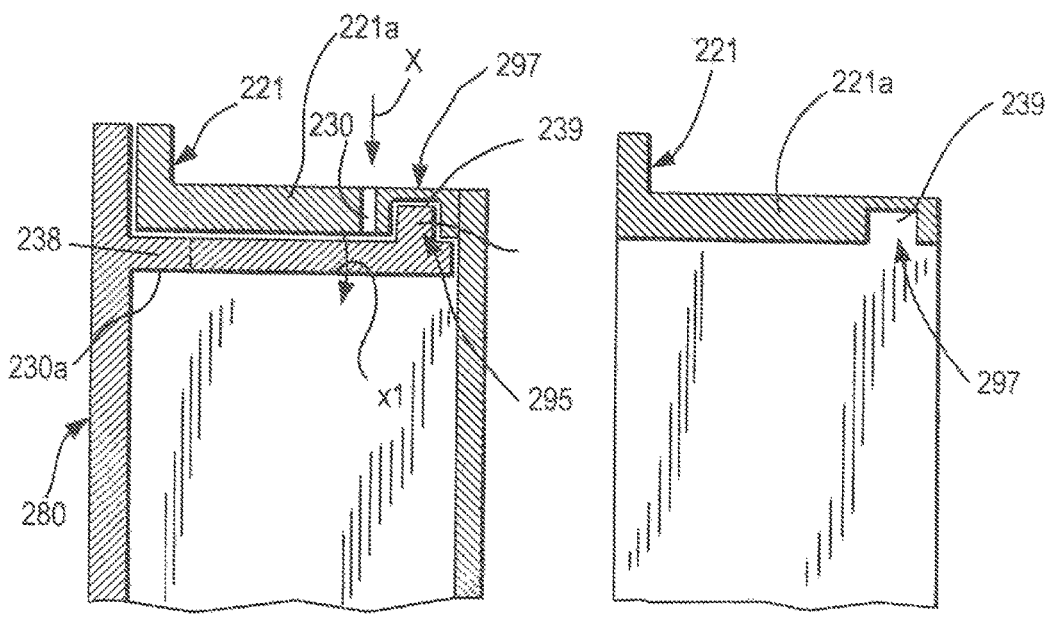
FIG. 17 shows an enlarged diagrammatic side view of a section of the design cover with the flexible, tongue-shaped side wall section, which carries at its free end the detent cam which engages into the depression on the underside of the side wall of the base housing.
FIG. 18 shows an enlarged diagrammatic side view of a section of the base housing with the depression, formed in the side wall of the base housing, to receive the detent cam.

When the design cover 280 is folded into the base housing 221, then the two side walls 221a and 230a lie one over the other, so that the engagement element 296 is in operative connection with holding element 297. If the detent connection 240 between the engagement element 296 and the holding element 297 is to be released to open the design cover 280, then the tongue-shaped side wall section 235 in the side wall 230a of the design cover 280 must be bent towards the swivel axis 226 of the design cover 280, so that the engagement element 296, i.e. the detent cam 245, is moved out from the depression 239 in the side wall 221a of the base housing 221. This bending may take place for example by means of a pin-like object, such as for example a screwdriver. In order to make this possible, the side wall 221a of the base housing 221 can be provided with a slit-shaped recess or opening 330, which is arranged above the tongue-shaped side wall section 235 in the side wall 221a of the base housing 221, so that the actuating object is guided through the opening 330 and, with a downwards movement in the arrow direction X, is pressed against the tongue-shaped side wall section 235, whereby the latter is bent in the arrow direction X1 (FIGS. 17, 18 and 21).

Figure 20:
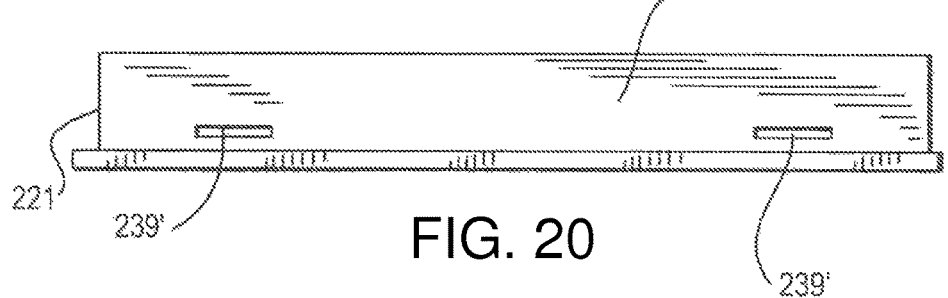
FIG. 20 shows an enlarged view from above onto the base housing with two holding elements provided in the upper side wall of the base housing, in the form of slit-shaped openings for the engagement of the engagement elements on the tongue-shaped side wall sections of the design cover.
Figure 21:
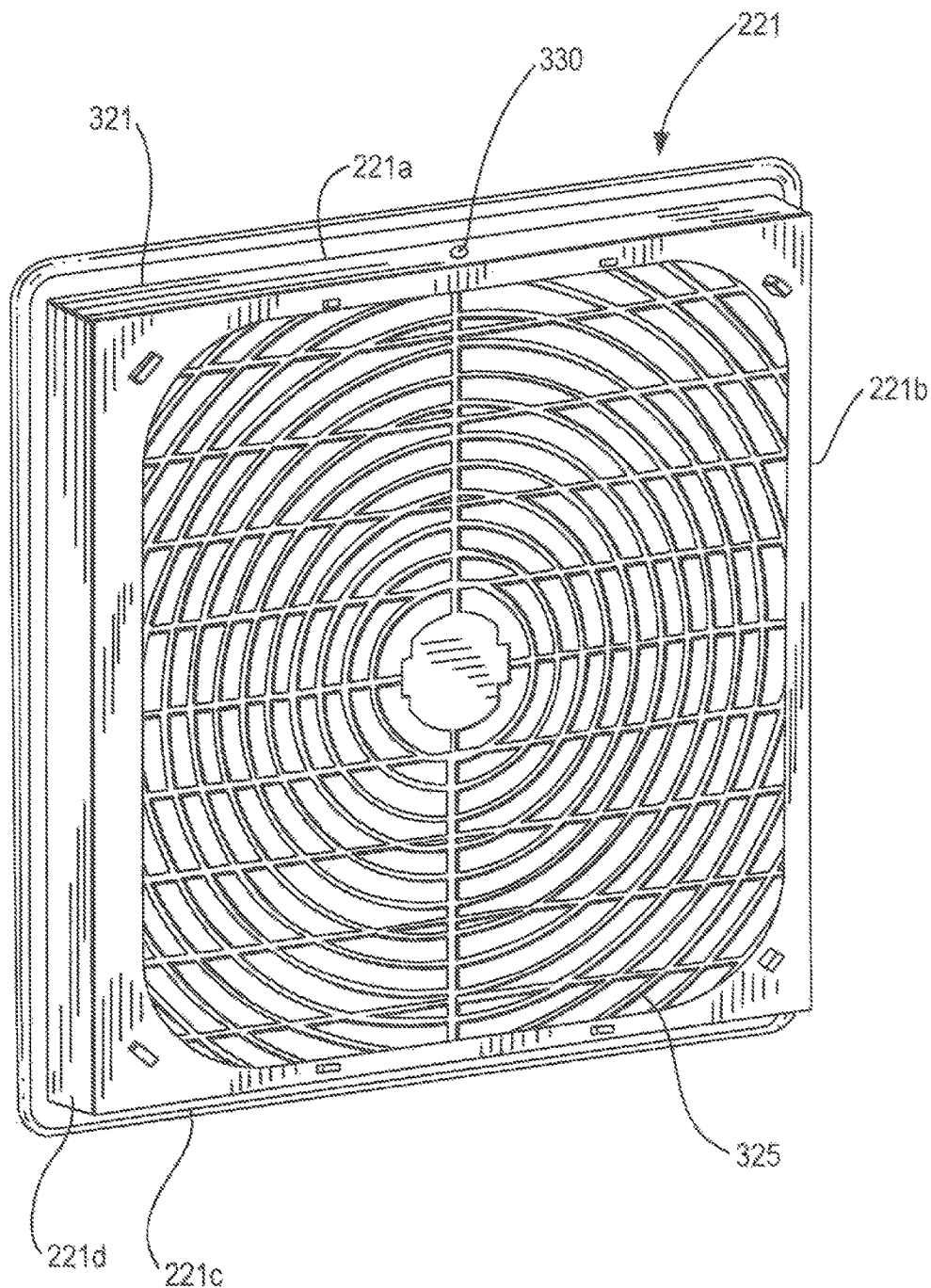
FIG. 21 shows a diagrammatic rear view onto the base housing of the air passage device.
Figure 22:
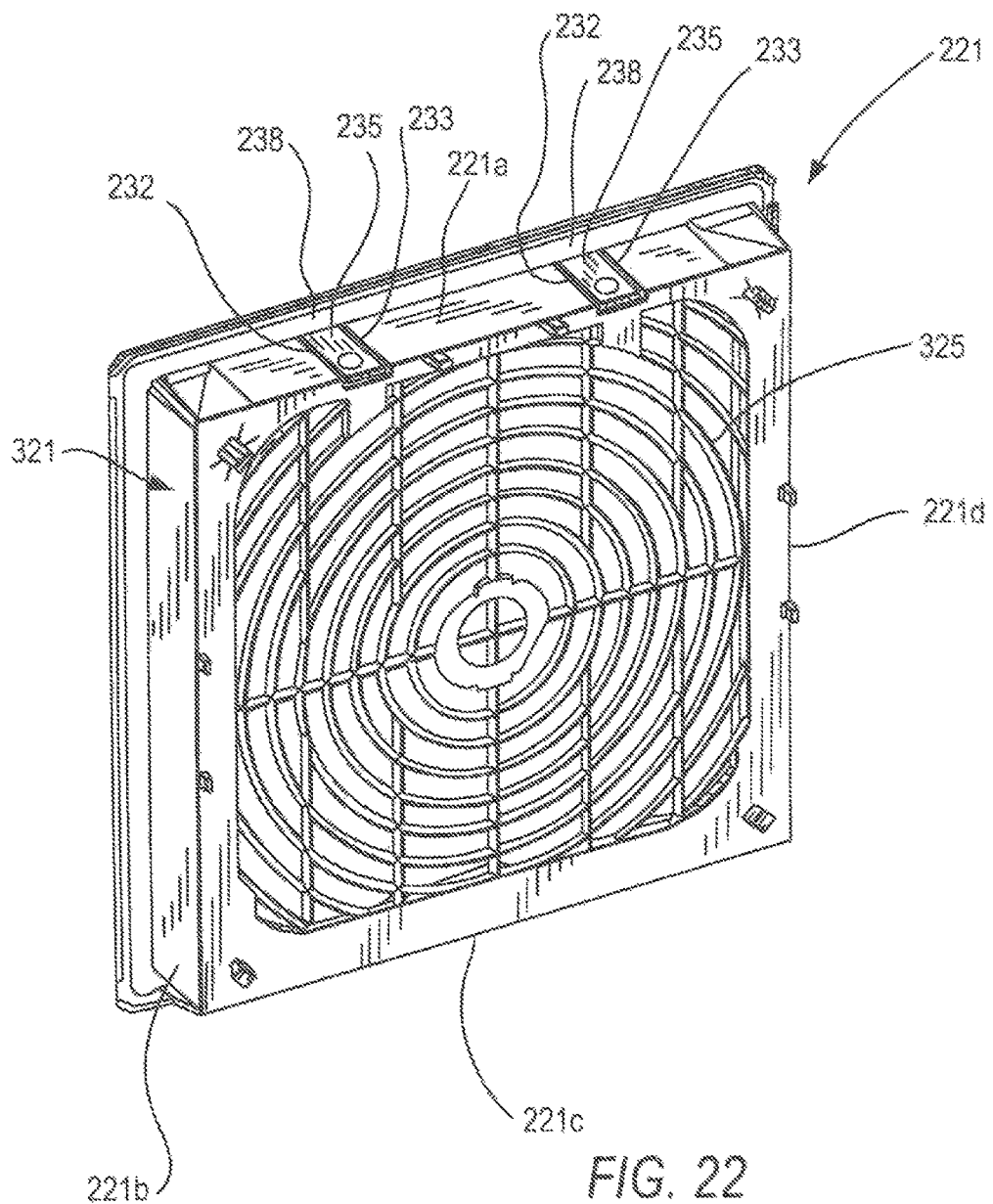
FIG. 22 shows a diagrammatic view onto the base housing of the air passage device with holding elements, formed as depressions, in flexible, tongue-shaped side wall sections formed in the upper side wall.
Figure 23:
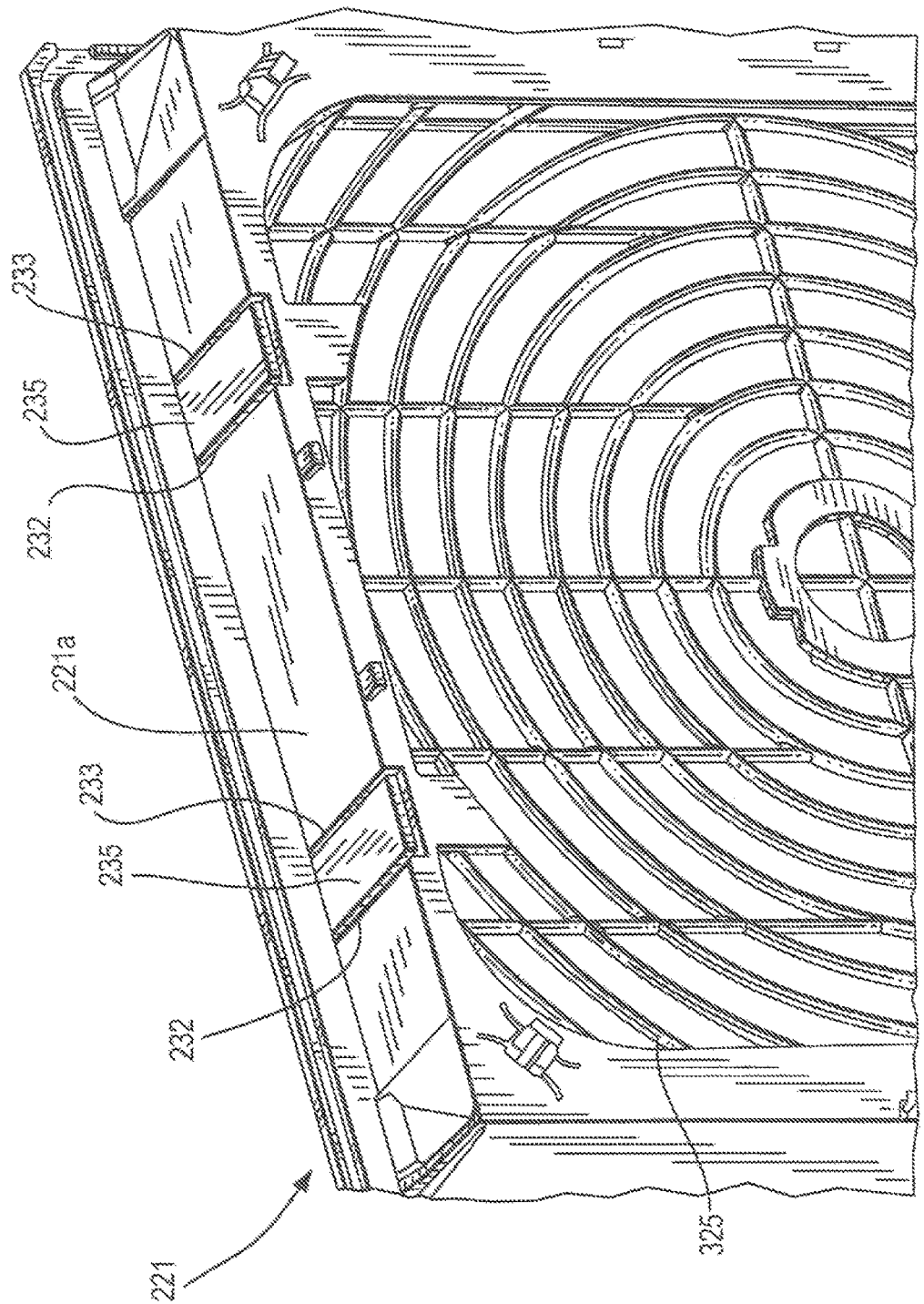
FIG. 23 shows an enlarged diagrammatic view of the upper section of the base housing according to FIG. 22.
Figure 24:
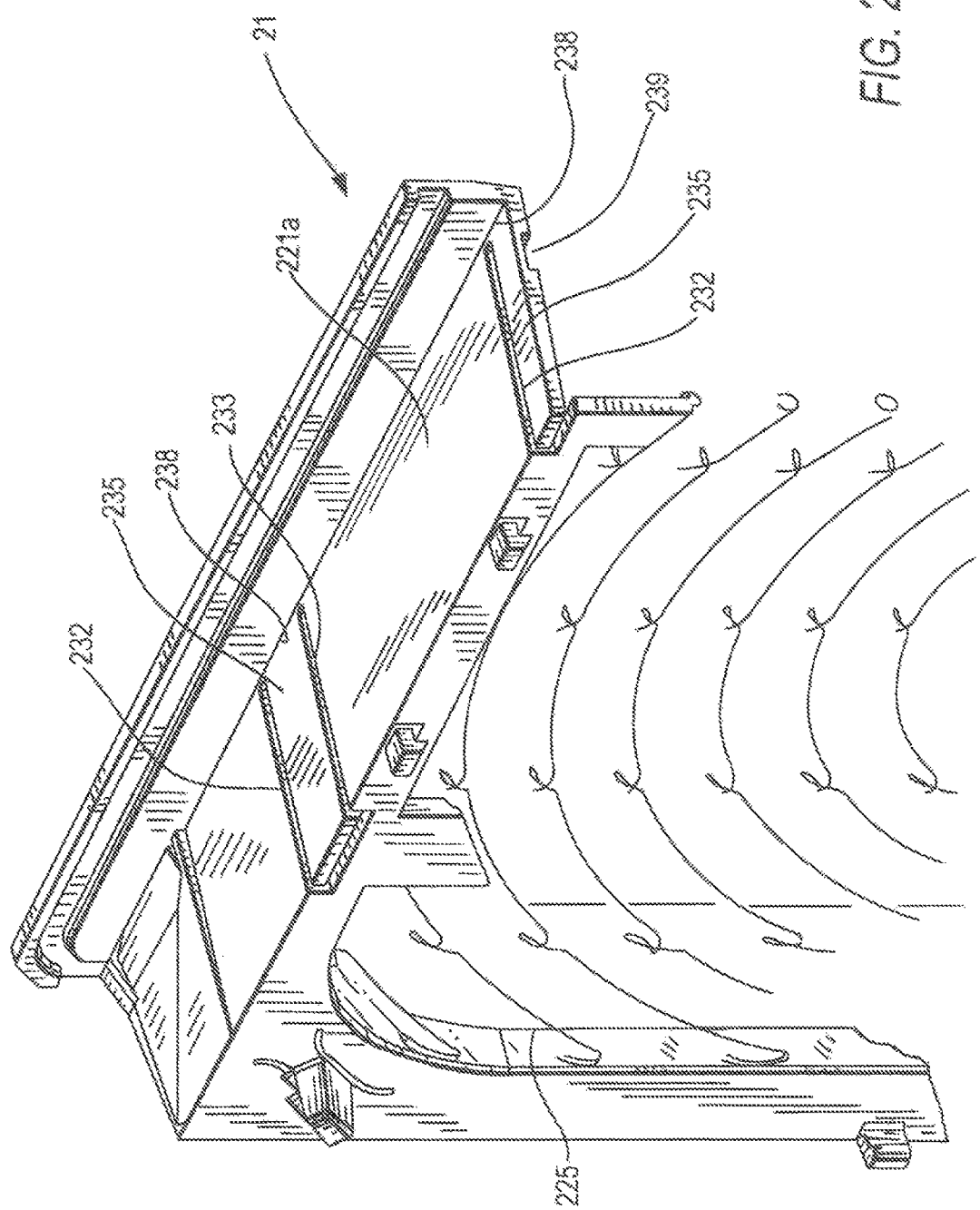
FIG. 24 shows an enlarged diagrammatic view of a part of the upper section of the base housing according to FIG. 22.
Figure 25:
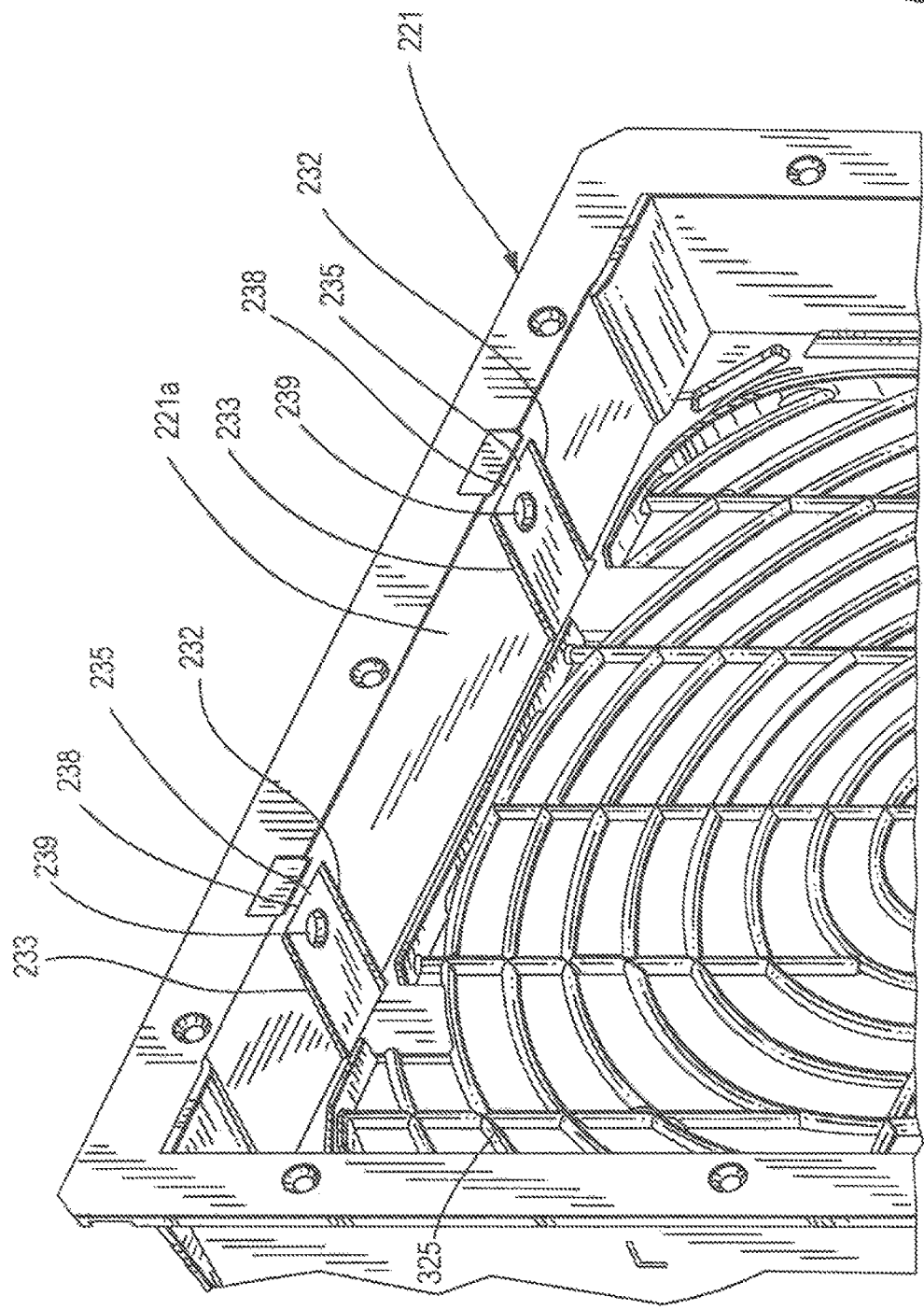
FIG. 25 shows an enlarged diagrammatic view of the upper section of the base housing with a view from below onto the side wall having the tongue-shaped side wall sections.

In the embodiment according to FIGS. 20 and 21, two tongue-shaped side wall sections 235 are provided in the upper regions or in the side walls 221a, 230a of the design cover 280 and of the base housing 221, and two holding elements 297 corresponding to the tongue-shaped side wall sections 235 are provided in the respective side walls 230a, 221a of the frames 230, 321 of the design cover 280 and of the base housing 221.

Figure 19:
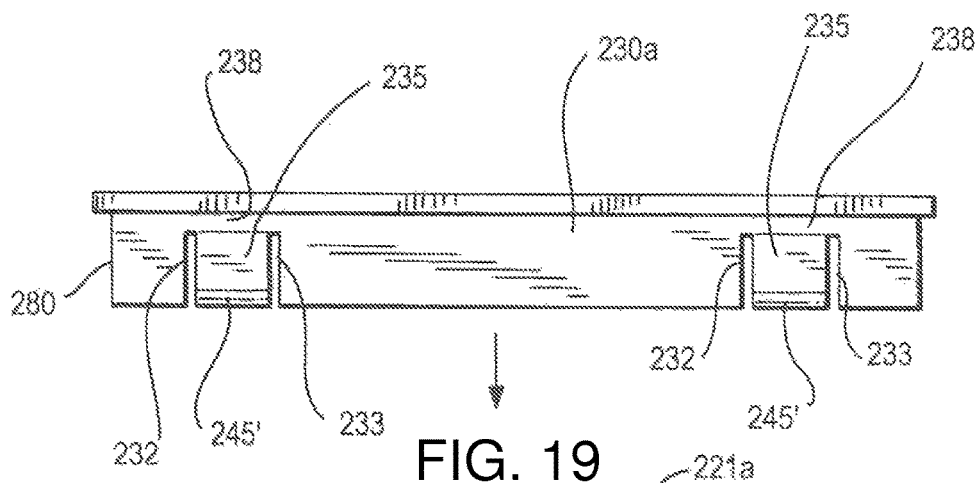
FIG. 19 shows an enlarged view from above onto the design cover with two formed in the upper side wall of the design cover with engagement elements, carrying at their ends, in the form of detent cams to produce the detent connection between the design cover and the base housing of the air passage device.

The two tongue-shaped side wall sections 235 are likewise constructed so as to be flexibly elastic and are connected via the cross-pieces 238 with the material of the design cover 280. At their free ends, the tongue-shaped side wall sections 235 have sections 245' bent at right-angles, which form the engagement elements 296 (FIG. 19). When the design cover 280 is closed, these bent sections 245' engage into slit-shaped recesses or depressions or openings 239', which are provided in the side wall 221a of the base housing 221 corresponding to the side wall 230a of the design cover 280 (FIG. 20).

The preceding example embodiments assume that the detent connection 240 is provided with respect to the swivel axis for the design cover 280, i.e. in the upper region of the air passage device. However, provision is made according to the invention that the design cover 280 is swivellably arranged on any desired side wall 221a, 221b, 221c, 221d of the frame 321 of the base housing 221, in which the detent connection 240 for the design cover 280 and the base housing 221 is provided on the side walls of the design cover 280, lying opposite the swivel axis for the design cover 280, and the base housing 221.

Figure 26:
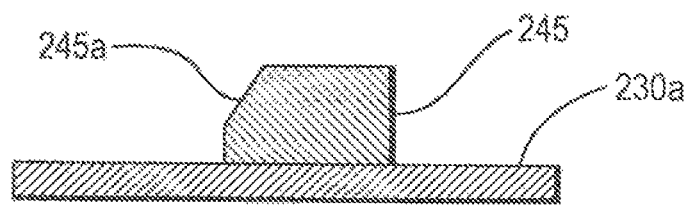
FIGS. 26 and 26A show enlarged diagrammatic views of engagement elements constructed as detent cams.
Figure 26A:
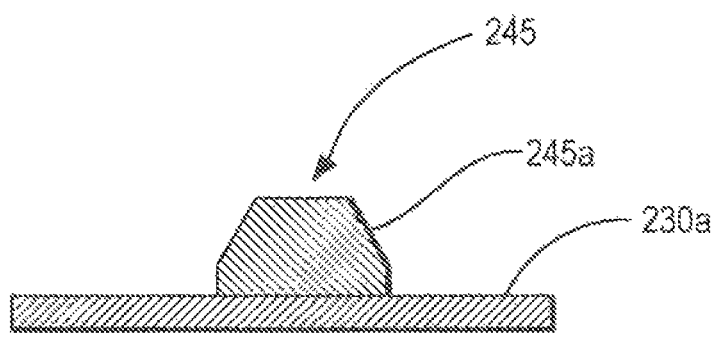

In the embodiment according to FIGS. 22 to 25, to produce the detachable detent connection 240 between the design cover 280 and the base housing 221 of the air passage device in the upper side wall 221a of the frame 321 of the base housing 221, two flexible tongue shaped side wall sections 235 are formed from the material of the side wall 221a, separated from the remaining side wall surface by slits 232, 233 running transversely to the longitudinal direction of the side wall. Each tongue-shaped side wall section 235 is held by means of a cross-piece 238 in the side wall 221a. The tongue-shaped wall section 235 is provided on the inner wall side with a holding element 297 in the form of a preferably circular depression 239 or opening, bore or blind-end bore. This depression 239 is able to be brought into operative connection with an engagement element 296 of the design cover 280 in the form of a detent cam 245. This detent cam 245 is arranged or formed on the side wall 230a of the design cover 280, which corresponds to the side wall 221a of the base housing 221 having the holding element 297. The detent cam 245 has at its free end a section 245a running conically toward the detent cam end (FIGS. 26 and 26A). Instead of a chamfered section 245a, the detent cam 245 may also have an encircling section running conically to the detent cam end 245b.

In the previously described embodiment, the side walls 221a, 230a each have two tongue-shaped side wall sections 235 with holding elements 297 and engagement elements 296 corresponding thereto. The detent connection 240 may also be produced with a holding element 297 and an engagement element 296.

The cooperation of the holding elements 297 with the engagement elements 296 takes place as follows in an embodiment according to FIGS. 22 to 25: When the design cover 280 is opened and is folded onto the base housing 221, then the tongue-shaped side wall section 235 of the side wall 221a of the base housing 221 slides over the detent cam 245 of the side wall 230a of the design cover 280, in which the tongue-shaped side wall section 235, owing to its flexible characteristic is slightly raised, so that the free end of the tongue-shaped side wall section 235 slides over the detent cam 245. This sliding movement is assisted by the chamfered section 245a at the end of the detent cam 245. The tongue-shaped side wall section 235 slides, on closing of the design cover 280, so far over the detent cam 245 until the detent cam 245 engages into the depression 239 on the underside of the tongue-shaped side wall section 235. This engaging is assisted by the restoring capacity of the tongue-shaped side wall section 235 from the bent position into the initial position, i.e. into the plane of the side wall 221a of the base housing 221. In the closed state, the design cover 280 lies against the base housing 221, in which the encircling side walls 221a, 221b, 221c, 221d of the base housing overlap the encircling side walls 230a, 230b, 230c, 230d of the design cover 280.

The opening of the design cover 280 takes place by a tug-like withdrawal of the design cover from the base housing, in which the detent cam 245 slides out from the depression 239. This withdrawal is assisted by a conical marginal shaping of the depression 239 and by the chamfered end section 245a of the detent cam 245.

While specific embodiments of the invention have been shown and described in detail to illustrate the inventive principles, it will be understood that the invention may be embodied otherwise without departing from such principles.

I claim:

1. An air passage device,
   wherein the air passage device is a filter fan or an outlet filter,
   wherein the air passage device comprises a base housing having a frame made of four side walls, said four side walls being one upper side wall, two lateral side walls and one lower side wall, said four side walls each being of substantially planar shape,
   wherein the air passage device further comprises a design cover having a frame made of four side walls, said four side walls being one upper side wall, two lateral side walls and one lower side wall, said four side walls each being of substantially planar shape,
   wherein the frame of the base housing and the frame of the design cover have a rectangular shape,
   wherein a filter mat is disposed between the base housing and the design cover,
   wherein the upper side wall of the design cover comprises at least four slits running transversely to a longitudinal direction of the upper side wall of the design cover, said at least four slits forming at least two elastic side wall sections in the upper side wall of the design cover, said at least two side wall sections being in a common plane with the upper side wall of the design cover,
   wherein the at least two elastic side wall sections each have a detent cam that protrudes from an upper side of the respective elastic side wall section,
   wherein a lower side of the upper side wall of the base housing has at least two holding elements, said holding elements being recess, opening or depression,
   wherein the holding elements are capable of being brought into operative connection with the detent cams on the elastic side wall sections so that a locking arrangement between the design cover and the base housing can be established,
   wherein the at least four slits forming the at least two elastic side wall sections are smaller than a width of the upper side wall of the design cover, and
   wherein the design cover is engaged with its side walls with the base housing so that the design cover is swivellably arranged on the base housing about a horizontal or vertical swivel axis.

2. The air passage device according to claim 1, wherein the at least four slits forming the at least two elastic side wall sections run at a right angle to the longitudinal direction of the upper side wall.

3. The air passage device according to claim 1, wherein the at least two elastic side wall sections are disposed at a distance to corner regions of the frame of the design cover.

4. The air passage device according to claim 1, wherein the frame of the design cover further comprises a circumferential contact edge, wherein the upper side wall of the design cover has a first end. and a second end in a transversal direction of the upper side wall of the design cover, wherein the first end of the upper side wall of the design cover in the transversal direction is attached to the contact edge in a perpendicular way along an entire length of the upper side wall of the design cover.

5. The air passage device according to claim 4, wherein the at least four slits forming the at least two elastic side wall section are disposed at the second end of the upper side wall of the design cover in the transversal direction.

6. The air passage device according to claim 4, wherein cross pieces are provided in the upper side wall of the design cover between the at least four slits and the first end of the upper side wall of the design cover in the transversal direction.

7. The air passage device according to claim 1, wherein the detent cams are formed at free ends of the at least two elastic side wall sections.

8. The air passage device according to claim 1, wherein the at least four slits forming the at least two elastic side wall sections have a width that is considerably smaller than a a width of the at least two elastic side wall sections.

* * * * *